US010255979B1

(12) United States Patent
Shimura et al.

(10) Patent No.: US 10,255,979 B1
(45) Date of Patent: Apr. 9, 2019

(54) SEMICONDUCTOR MEMORY DEVICE

(71) Applicant: Toshiba Memory Corporation, Minato-ku (JP)

(72) Inventors: Yasuhiro Shimura, Yokohama (JP);
Shinichi Oosera, Yokohama (JP);
Junichi Kijima, Kawasaki (JP);
Tomoki Higashi, Yokohama (JP);
Sumito Ohtsuki, Yokohama (JP);
Tomohiro Oda, Yokohama (JP);
Keisuke Yonehama, Kamakura (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,570

(22) Filed: Mar. 9, 2018

(30) Foreign Application Priority Data

Sep. 20, 2017 (JP) .................................. 2017-180295

(51) Int. Cl.
*G11C 16/28* (2006.01)
*G06F 12/0893* (2016.01)
*G11C 16/16* (2006.01)
*G11C 16/34* (2006.01)

(52) U.S. Cl.
CPC .......... *G11C 16/28* (2013.01); *G06F 12/0893* (2013.01); *G11C 16/16* (2013.01); *G11C 16/344* (2013.01); *G06F 2212/2022* (2013.01); *G11C 2207/2245* (2013.01)

(58) Field of Classification Search
CPC ....... G11C 16/28; G11C 16/16; G11C 16/344; G11C 2207/2245; G06F 12/0893; G06F 2212/2022

USPC .................................................... 365/185.22
See application file for complete search history.

(56) References Cited

U.S. PATENT DOCUMENTS

| 6,442,068 | B1 * | 8/2002 | Bartoli | G11C 16/10 |
| | | | | 365/185.12 |
| 9,564,220 | B2 * | 2/2017 | An | G11C 16/0483 |
| 2006/0221696 | A1 | 10/2006 | Li | |
| 2009/0089488 | A1 | 4/2009 | Yasui | |
| 2012/0044764 | A1 | 2/2012 | Nakai et al. | |

(Continued)

FOREIGN PATENT DOCUMENTS

| JP | 2008-34045 | 2/2008 |
| JP | 2009-87028 | 4/2009 |

(Continued)

*Primary Examiner* — Fernando Hidalgo
(74) *Attorney, Agent, or Firm* — Oblon, McClelland, Maier & Neustadt, L.L.P.

(57) ABSTRACT

According to one embodiment, a semiconductor memory device includes: a memory cell array including a plurality of memory strings, each of the memory strings including a plurality of memory cells connected in series; a plurality of word lines commonly connected to the memory strings and connected to the memory cells; and a control circuit which executes a write operation including a plurality of program loops, each of the program loops including a program operation and a verify operation. When a suspend command for instructing an operation suspend is externally received during execution of the program operation, the control circuit executes a dummy read operation in which the word lines are applied with a voltage after the program operation, and enters into a suspend mode after the dummy read operation.

20 Claims, 24 Drawing Sheets

(56) References Cited

U.S. PATENT DOCUMENTS

2012/0179860 A1    7/2012   Falanga et al.
2016/0365150 A1   12/2016   Tokiwa

FOREIGN PATENT DOCUMENTS

| JP | 2009-536424 | 10/2009 |
| JP | 2012-43496 | 3/2012 |
| JP | 2012-529692 | 11/2012 |
| JP | 2017-4583 | 1/2017 |

* cited by examiner

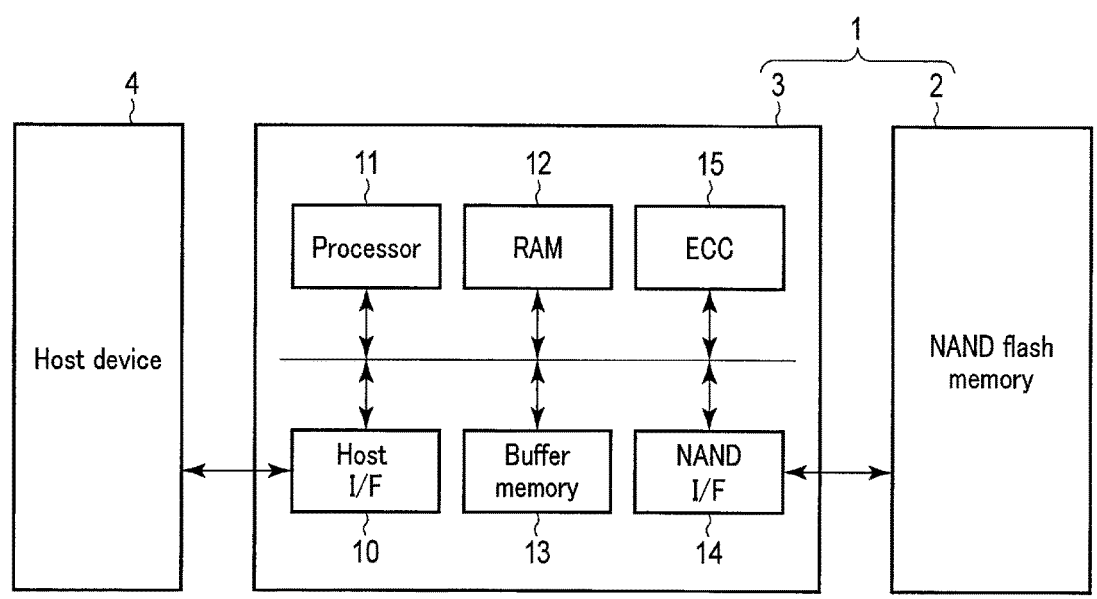
F I G. 1

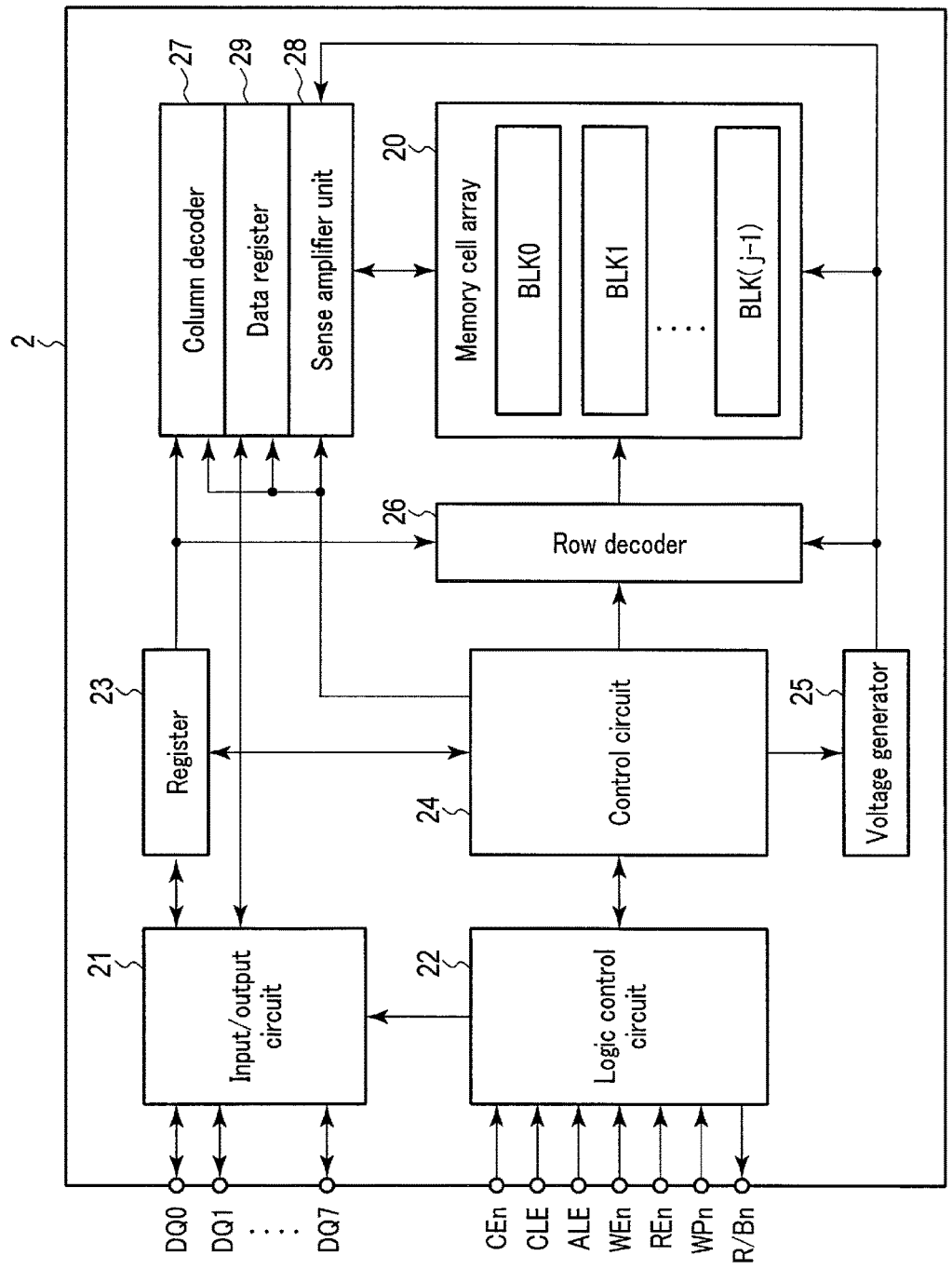
F I G. 2

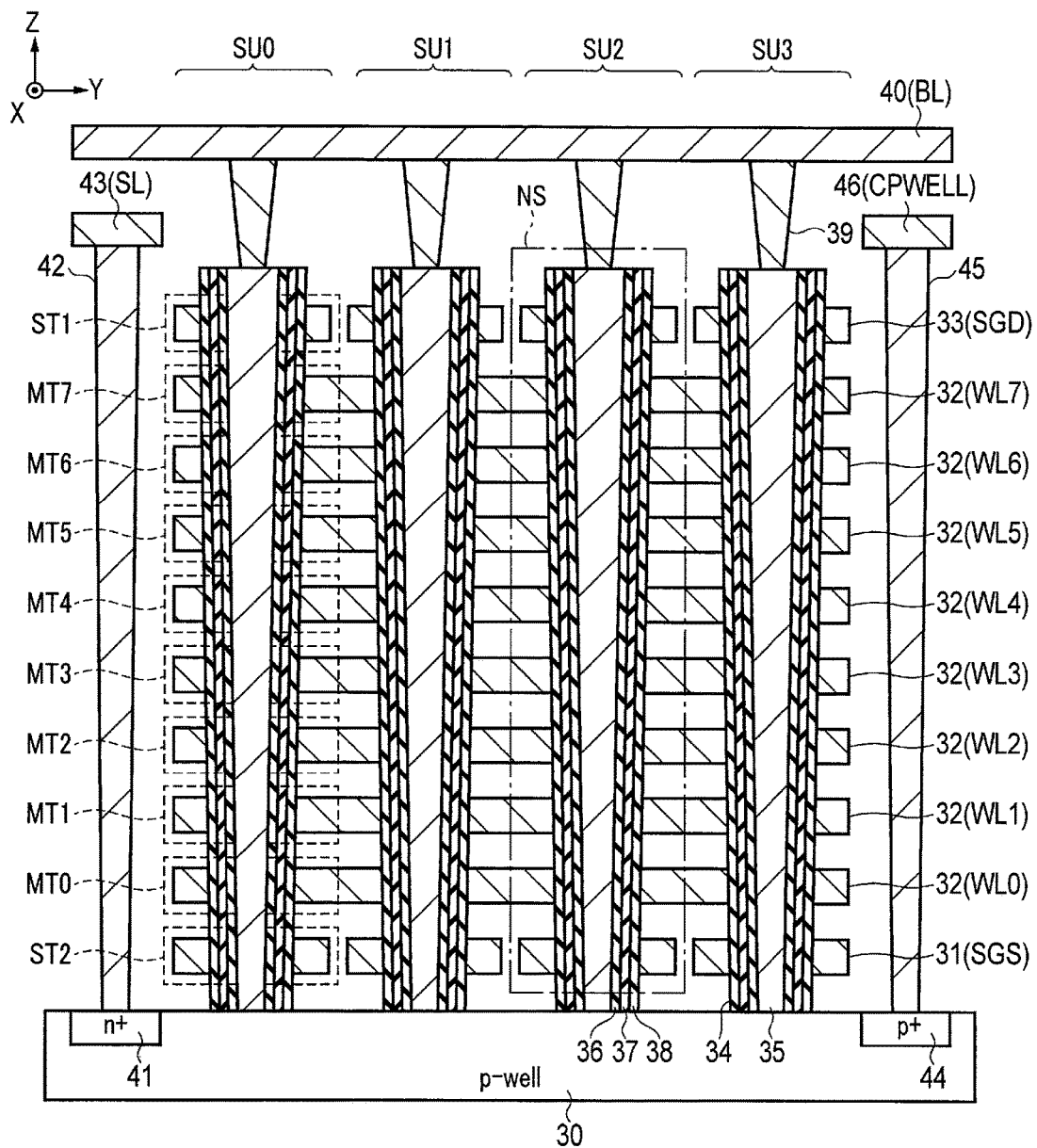
F I G. 4

| Operation | <100 μs~10ms | 100 μs~10ms< | <Several min. To several tens of min. |
|---|---|---|---|
| Program | 2nd read state | 1st read state | 1st read state |
| Read | 2nd read state | 2nd read state | 1st read state |

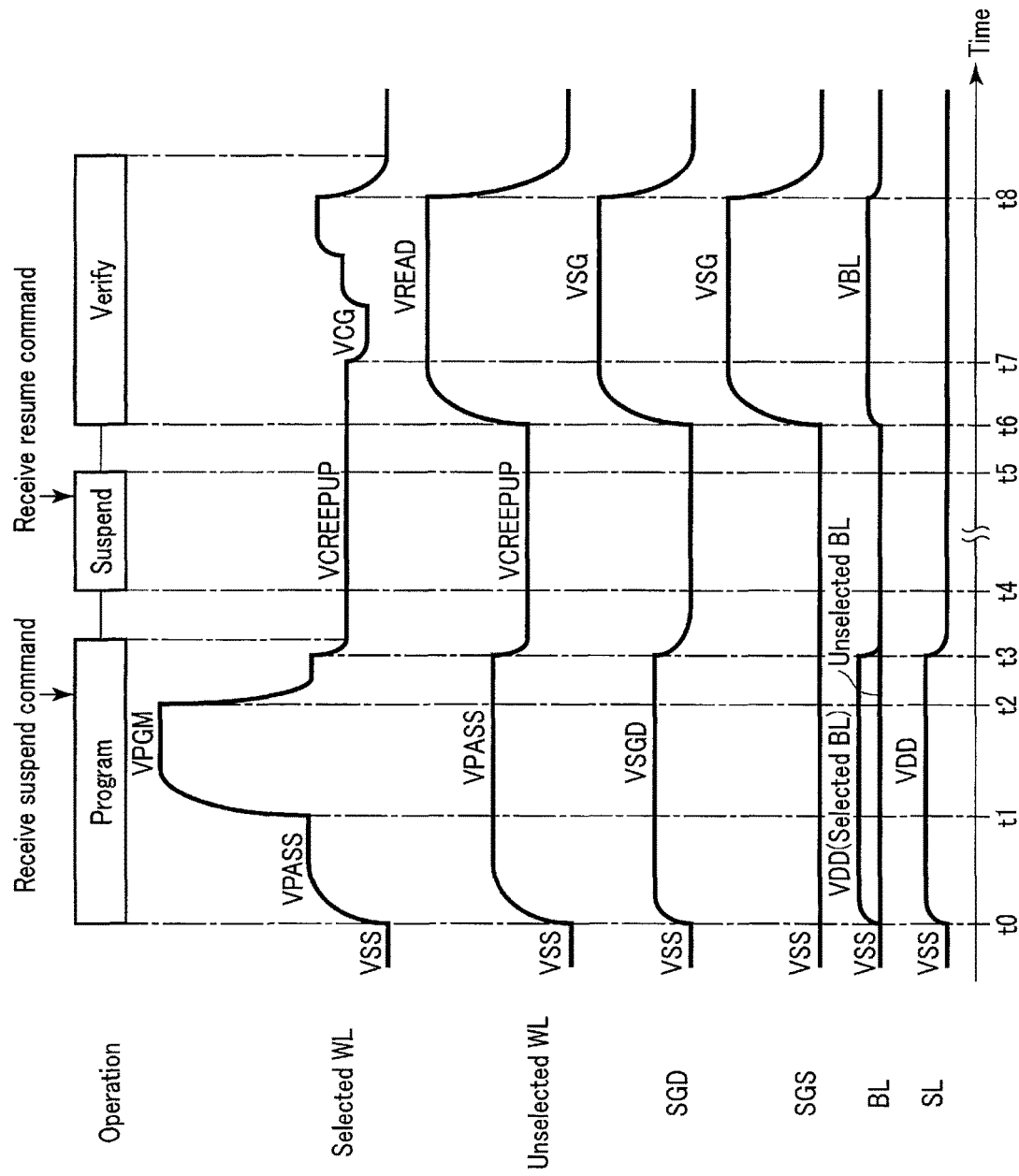
F I G. 13

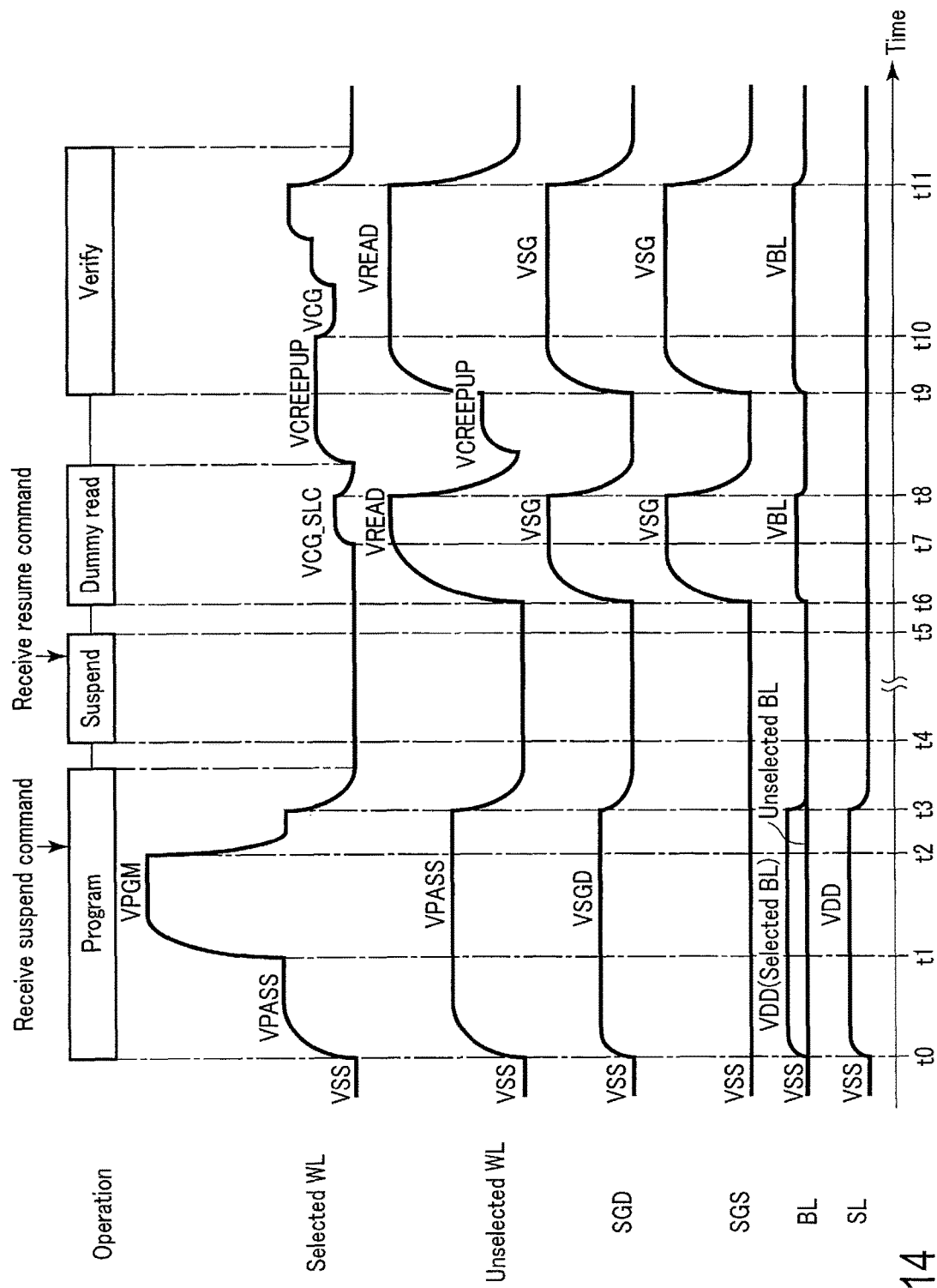
F I G. 14

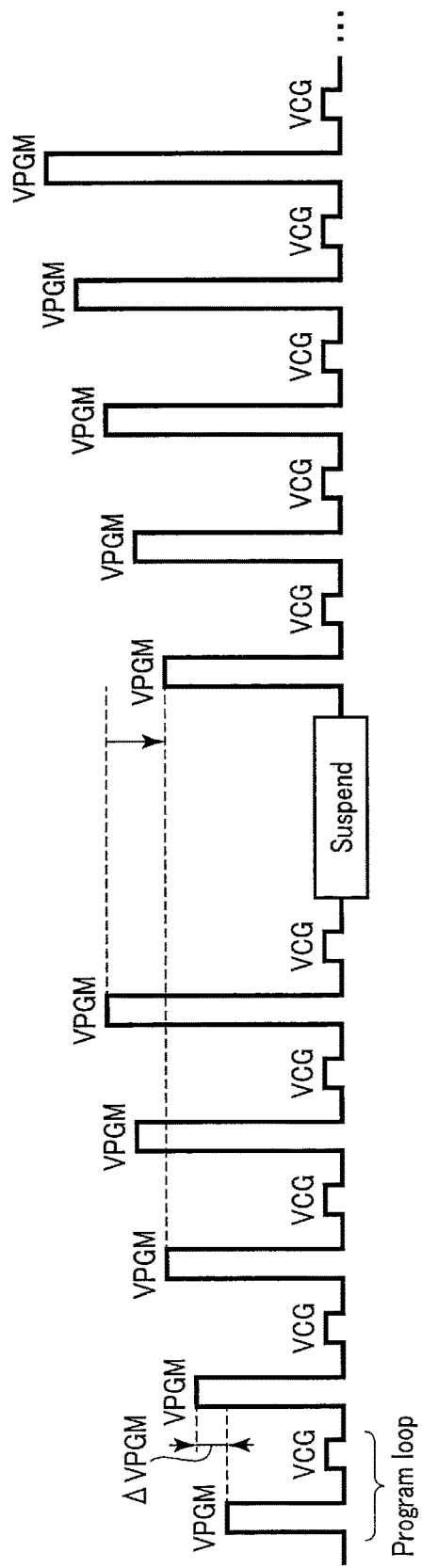
F I G. 16

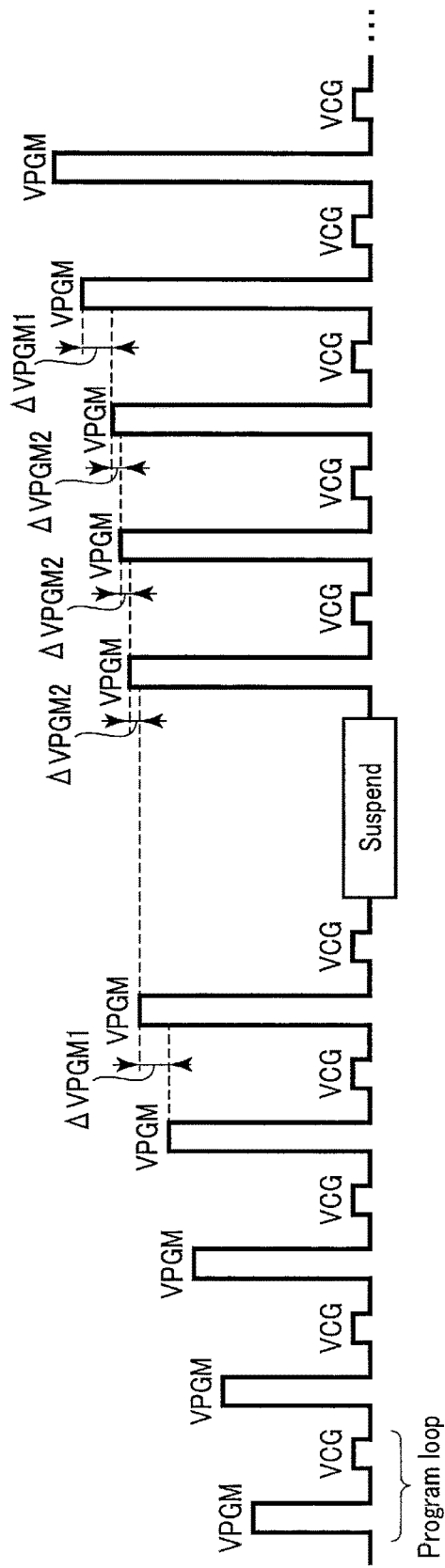
F I G. 19

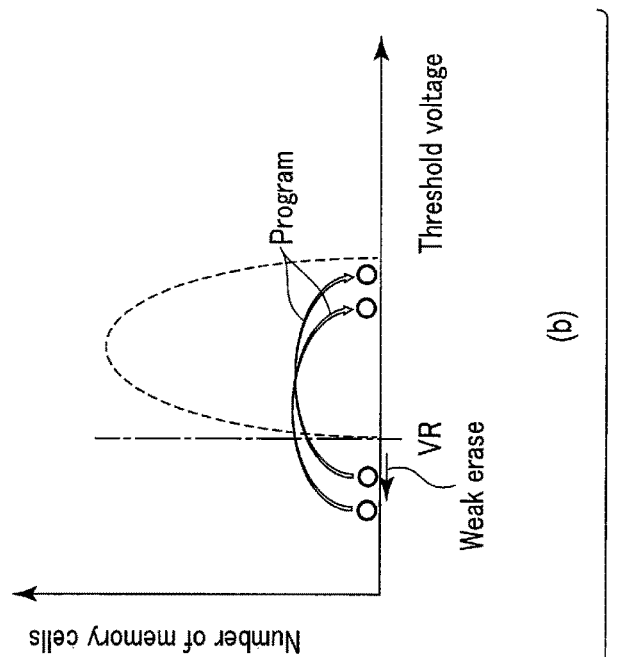
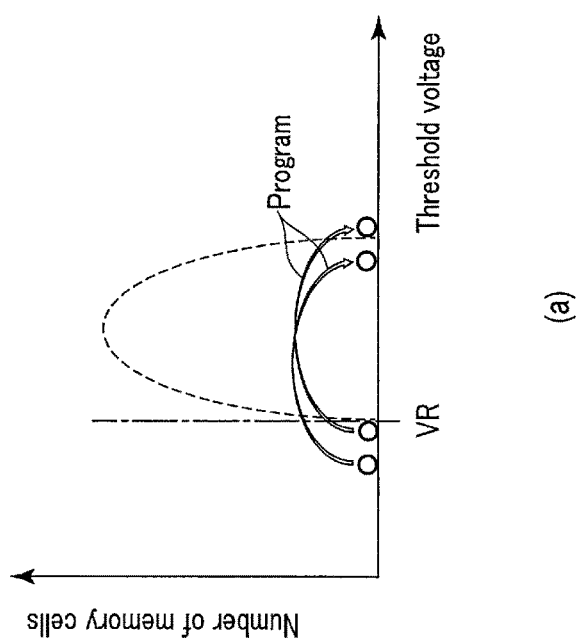
F I G. 25

SEMICONDUCTOR MEMORY DEVICE

CROSS-REFERENCE TO RELATED APPLICATIONS

This application is based upon and claims the benefit of priority from Japanese Patent Application No. 2017-180295, filed Sep. 20, 2017, the entire contents of which are incorporated herein by reference.

FIELD

The embodiments of the present invention relate generally to a semiconductor memory device.

BACKGROUND

As one type of semiconductor memory device, a NAND flash memory is known in the art. Also, a NAND flash memory wherein memory cells are arranged three-dimensionally is known in the art.

BRIEF DESCRIPTION OF THE DRAWINGS

FIG. 1 is a block diagram showing a memory system according to the first embodiment;

FIG. 2 is a block diagram of the NAND flash memory system shown in FIG. 1;

FIG. 4 is a sectional view of a partial region of the block BLK;

FIG. 13 is a timing chart illustrating a write operation performed by a NAND flash memory according to the third embodiment;

FIG. 14 is a timing chart illustrating a write operation performed by a NAND flash memory according to the fourth embodiment;

FIG. 16 is a timing chart illustrating an example of a write operation performed by the NAND flash memory of the fifth embodiment;

FIG. 19 is a timing chart illustrating an example of a write operation performed by the NAND flash memory of the sixth embodiment;

FIG. 25 is a schematic diagram illustrating how a program operation is performed after a weak erase operation.

DETAILED DESCRIPTION

Figure 3:
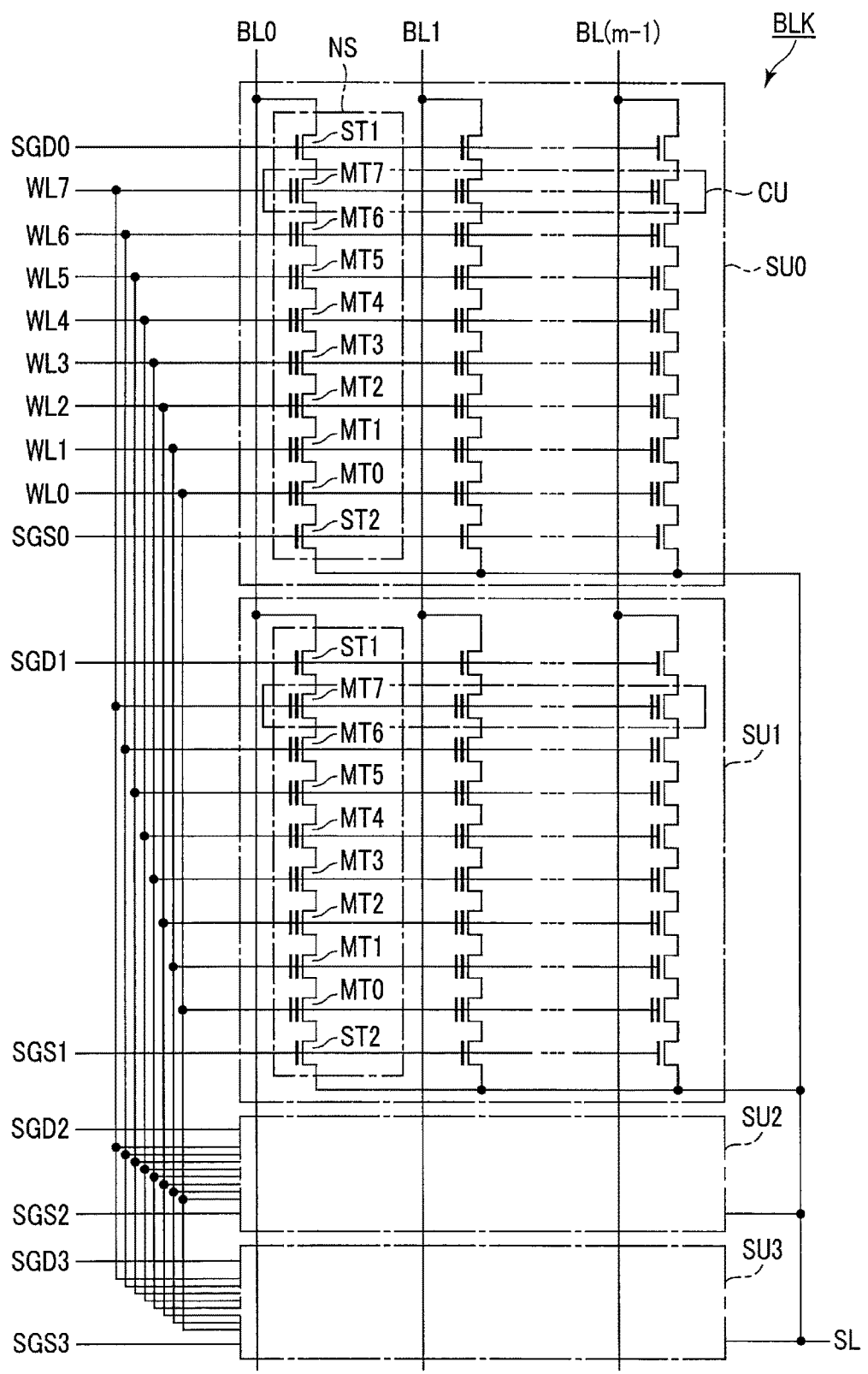
FIG. 3 is a circuit diagram of one block BLK included in a memory cell array.

In general, according to one embodiment, there is provided a semiconductor memory device comprising:

a memory cell array including a plurality of memory strings, each of the memory strings including a plurality of memory cells connected in series;

a plurality of word lines commonly connected to the memory strings and connected to the memory cells; and a control circuit which executes a write operation including a plurality of program loops, each of the program loops including a program operation in which a program voltage is applied to a selected word line and a verify operation in which a threshold voltage of a memory cell is verified, wherein when a suspend command for instructing an operation suspend is externally received during execution of the program operation, the control circuit executes a dummy read operation in which the word lines are applied with a voltage after the program operation, and enters into a suspend mode after the dummy read operation.

A description will now be given of the embodiments with reference to the accompanying drawings. Several embodiments described below merely show exemplary apparatuses and methods that implement the technical ideas of the present invention. The technical ideas are not limited by the element shapes, structures, arrangements etc. described below. Each of the function blocks can be implemented in the form of hardware, software or a combination of them. The function blocks need not be such blocks as will be described below. For example, part of the functions of one exemplary function block may be implemented by another function block. In addition, an exemplary function block may be divided into more specific function blocks. In the description below, structural elements having substantially the same functions and configurations will be denoted by the same reference symbols, and a repetitive description of such elements will be given only where necessary.

[1] First Embodiment

[1-1] Configuration of Memory System

FIG. 1 is a block diagram showing a memory system 1 according to the first embodiment. The memory system 1 comprises a NAND flash memory (semiconductor memory device) 2 and a memory controller 3.

The memory system 1 may be configured by providing a plurality of chips (which constitute the memory system 1) on a motherboard on which a host device is provided; alternatively, the memory system 1 may be configured as such a one-module element as a system LSI (large-scale integrated circuit) or an SoC (system on chip). Examples of the memory system 1 include a memory card such as a SD™ card, an SSD (solid state drive) and an eMMC (embedded multimedia card).

The NAND flash memory 2 includes a plurality of memory cells and stores data in a nonvolatile manner. A specific configuration of the NAND flash memory 2 will be described later.

In response to an instruction supplied, for example, from a host device 4, the memory controller 3 instructs the NAND flash memory 2 to perform a write operation (referred to as a program operation as well), a read operation and an erase operation. The memory controller 3 manages the memory space of the NAND flash memory 2. The memory controller 3 includes a host interface circuit (host I/F) 10, a processor 11, a RAM (random access memory) 12, a buffer memory 13, a NAND interface circuit (NAND I/F) 14, an ECC (error checking and correcting) circuit 15, etc.

The host interface circuit 10 is connected to the host device 4 through a host bus and performs interface processing for the host device 4. The host interface circuit 10 exchanges instructions, addresses and data with reference to the host device 4.

The processor 11 is made of a CPU (central processing unit), for example. The processor 11 controls the entire operation of the memory controller 3. For example, when a write instruction is received from the host device 4, the processor 11 issues a write instruction based on the NAND interface to the NAND flash memory 2 in response to the received instruction. Similar operations are performed in read and erase operations as well. The processor 11 also executes various kinds of processes such as wear leveling to manage the NAND flash memory 2.

The RAM 12 is used as a work space of the processor 11 and stores firmware loaded from the NAND flash memory 2, various tables prepared by the processor 11, etc. The RAM 12 is, for example, a DRAM. The buffer memory 13 temporarily holds data transmitted from the host device 4 and temporarily holds data transmitted from the NAND flash memory 2.

When data is to be written, the ECC circuit 15 generates an error correcting code for the write data, adds the error correcting code to the write data, and transmits the resultant write data to the NAND interface circuit 14. When data is to be read, the ECC circuit 15 performs error detection and/or error correction for the read data, using the error correction code included in the read data. The ECC circuit 15 may be incorporated in the NAND interface circuit 14.

The NAND interface circuit 14 is connected to the NAND flash memory 2 through a NAND bus and performs interface processing for the NAND flash memory 2. The NAND interface circuit 14 exchanges instructions, addresses and data with reference to the NAND flash memory 2.

[1-1-1] Configuration of NAND Flash Memory 2

FIG. 2 is a block diagram of the NAND flash memory 2 shown in FIG. 1.

The NAND flash memory 2 includes a memory cell array 20, an input/output circuit 21, a logic control circuit 22, a register 23, a control circuit 24, a voltage generator 25, a row decoder 26, a column decoder 27, a sense amplifier unit 28, and a data register (data cache) 29.

The memory cell array 20 includes j blocks BLK0 to BLK(j−1). "j" is a natural number larger than 1. Each of the blocks is provided with a plurality of memory cell transistors. The memory cell transistors are made of electrically rewritable memory cells. A plurality of bit lines, a plurality of word lines and a source line are arranged in the memory cell array 20 so as to control the voltages applied to the respective memory cell transistors. A specific configuration of blocks BLK will be described later.

The input/output circuit 21 and the logic control circuit 22 are connected to the memory controller 3 through a NAND bus. The input/output circuit 21 exchanges signals DQ (e.g., DQ0 to DQ7) with reference to the memory controller 3 through the NAND bus.

The logic control circuit 22 receives external control signals (e.g., chip enable signal CEn, command latch enable signal CLE, address latch enable signal ALE, write enable signal WEn, read enable signal REn, and write protect signal WPn) from the memory controller 3 through the NAND bus. The "n" suffixed to the signal names indicates an active row. The logic control circuit 22 transmits a ready/busy signal R/Bn to the memory controller 3 through the NAND bus.

Chip enable signal CEn enables selection of the NAND flash memory 2. Signal CLE enables a command transmitted as signal DQ to be latched in the command register. Signal ALE enables an address transmitted as signal DQ to be latched in the address register. Signal WEn enables a write operation. Signal REn enables a read operation. Signal WPn inhibits a write operation and an erase operation. Signal R/Bn indicates whether the NAND flash memory 2 is in the ready state (i.e., a state in which an external instruction can be accepted) or a busy state (i.e., a state in which an external instruction cannot be accepted). The memory controller 3 can be informed of the state of the NAND flash memory 2 by receiving signal R/Bn.

The register 23 is provided with a command register, an address register, a status register, etc. The command register temporarily holds a command. The address register temporarily holds an address. The status register temporarily holds data required for the NAND flash memory 2 to operate. The register 23 is made of an SRAM, for example.

The control circuit 24 receives a command from the register 23 and comprehensively controls the NAND flash memory 2 in accordance with a sequence based on this command.

The voltage generator 25 receives a power supply voltage externally of the NAND flash memory 2 and generates a plurality of voltages for the write operation, read operation and erase operation, using the power supply voltage. The voltage generator 25 supplies the generated voltages to the memory cell array 20, row decoder 26, sense amplifier unit 28, etc.

The row decoder 26 receives a row address from the register 23 and decodes this row address. The row decoder 26 performs a selection operation for word lines, based on the decoded row address. The row decoder 26 transfers the voltages required for the write operation, read operation and erase operation to a selected block.

The column decoder 27 receives a column address from the register 23 and decodes this column address. The column decoder 27 selects one of the bit lines, based on the decoded column address.

When data is to be read, the sense amplifier unit 28 senses and amplifies data that is read from a memory cell transistor to a bit line. When data is to be written, the sense amplifier unit 28 transfers write data to a bit line.

When data is to be read, the data register 29 temporarily holds data transferred from the sense amplifier unit 28, and serially forwards the data to the input/output circuit 21. When data is to be written, the data register 29 temporarily holds data serially transferred from the input/output circuit 21, and forwards the data to the sense amplifier unit 28. The data register 29 is made of an SRAM, for example.

[1-1-2] Configuration of Block BLK

FIG. 3 is a circuit diagram of one block BLK included in the memory cell array 20. Each of the blocks BLK is provided with a plurality of string units SU. In FIG. 3, four string units SU0 to SU3 are shown by way of example. The number of string units SU included in one block BLK can be optionally determined.

Each of the string units SU includes a plurality of NAND strings (memory strings) NS. The number of NAND strings NS included in one string unit SU can be optionally determined.

Each of the NAND strings NS includes a plurality of memory cell transistors MT and two select transistors ST1 and ST2. The memory cell transistors MT are connected in series between the source of select transistor ST1 and the drain of select transistor ST2. In the present specification, the memory cell transistors may be referred to as memory cells or cells. FIG. 3 shows a configuration example in which NAND string NS is provided with eight memory cell transistors MT (MT0 to MT7), but the number of memory cell transistors MT provided in NAND string NS can be optionally determined. Each of memory cell transistors MT includes a control gate and a charge accumulation layer, and holds data in a nonvolatile manner. Each memory cell transistor MT can hold data of one bit or data of two or more bits.

The gates of select transistors ST1 of string unit SU0 are commonly connected to select gate line SGD0. Likewise, the gates of select transistors ST1 of string units SU1 to SU3 are connected to select gate lines SGD1 to SGD3, respectively. The gates of select transistors ST2 of string unit SU0 are commonly connected to select gate line SGS0. Likewise, the gates of select transistors ST2 of string units SU1 to SU3 are connected to select gate lines SGS1 to SGS3, respectively. The gates of select transistors ST2 in each block BLK may be commonly connected to select gate line SGS. The control gates of memory cell transistors MT0 to MT7 in each block BLK are connected to word lines WL0 to WL7, respectively.

Of the NAND strings NS arranged in the matrix pattern in each block BLK, the NAND strings NS of the same column have their drains commonly connected to any one of bit lines BL0 to BL(m-1). "m" is an integer larger than 1. The bit lines BL commonly connect the NAND strings NS of the respective string units SU, between a plurality of blocks BLK. The sources of select transistors ST2 included in each block BLK are commonly connected to a source line SL. Source line SL commonly connects a plurality of NAND strings NS between a plurality of blocks BLK.

The data in a plurality of memory cell transistors MT in each block BLK can be erased in a collective manner, for example. Data read and data write are collectively performed for a plurality of memory cell transistors MT commonly connected to one word line WL of one string unit SU. A set of memory cell transistors MT that share the same word line in one string unit SU is referred to as cell unit CU. The 1-bit data stored in a plurality of memory cell transistors MT included in cell unit CU is referred to as a page. In other words, the write operation and the read operation for cell unit CU are executed in units of pages.

NAND string NS may be provided with dummy cell transistors. To be specific, for example, two dummy cell transistors DT0 and DT1 are connected in series between select transistor ST2 and memory cell transistor MT0. For example, two dummy cell transistors DT2 and DT3 are connected in series between memory cell transistor MT7 and select transistor ST1. Dummy word lines DWL0 to DWL3 are connected to the gates of dummy cell transistors DT0 to DT3. The configurations of the dummy cell transistors are similar to those of the memory cell transistors. The dummy cell transistors are not for storing data and have a function of relieving the disturbance which the memory cell transistors and select transistors may undergo during the write operation and erase operation.

[1-1-3] Stacked Configuration of Block BLK

FIG. 4 is a sectional view of a partial region of block BLK. The X direction is a direction in which the select gate lines extend, the Y direction intersecting the X direction in a horizontal plane is a direction in which the bit lines extend, and the Z direction is a stacking direction.

A plurality of NAND strings NS are provided on a p-type well region (p-well) 30. That is, interconnect layer 31 functioning as select gate line SGS, eight interconnect layers 32 functioning as word lines WL0 to WL7, and interconnect layer 33 functioning as select gate line SGD are stacked on the well region 30 in order. Insulating films (not shown) are provided between the stacked interconnect layers.

A memory hole 34 penetrates interconnect layers 31, 32 and 33 and reaches the well region 30. A pillar-shaped semiconductor layer (semiconductor pillar) 35 is provided inside the memory hole 34. A gate insulation film 36, a charge storage layer (an insulation film) 37, and a block insulation film 38 are formed on the side wall of the semiconductor layer 35 in the order mentioned. By these elements, memory cell transistors MT and select transistors ST1 and ST2 are formed. The semiconductor layer 35 functions as a current path of the NAND string NS and is a region in which the channels of the transistors are formed. The upper end of each semiconductor layer 35 is connected via contact plug 39 to a metal interconnect layer 40 functioning as the bit line BL.

An $n^+$-type impurity diffusion layer 41 doped with n type impurities at high concentration is provided in the surface region of the well region 30. A contact plug 42 is provided on the diffusion layer 41. The contact plug 42 is connected to a metal interconnect layer 43 functioning as the source line SL. In addition, a $p^+$-type impurity diffusion layer 44 doped with p type impurities at high concentration is provided in the surface region of the well region 30. A contact plug 45 is provided on the diffusion layer 44. The contact plug 45 is connected to a metal interconnect layer 46 functioning as a well interconnect layer CPWELL. The well interconnect layer CPWELL is an interconnect layer used to apply a Potential to the semiconductor layers 35 via the well region 30.

A plurality of configurations described above are arranged in the depth direction of the drawing sheet of FIG. 4 (the X direction). Each string unit SU is formed by a group of NAND strings NS arranged in the depth direction.

[1-1-4] Threshold Distributions of Memory Cell Transistors

Figure 5:
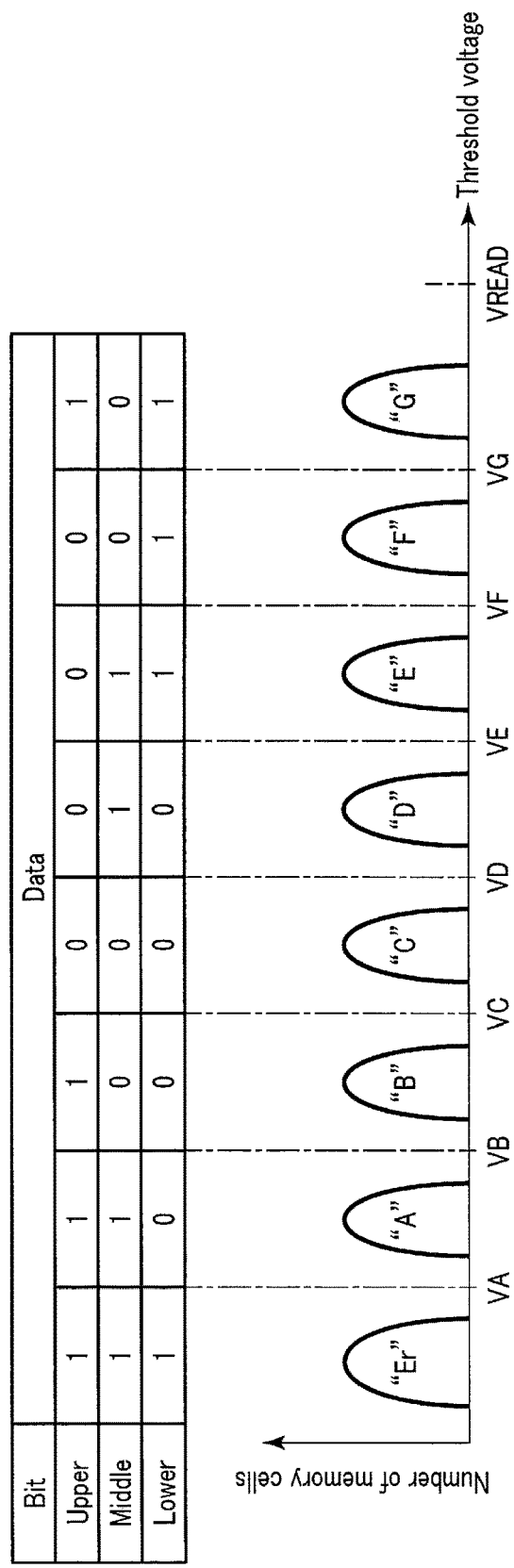
FIG. 5 is a schematic diagram illustrating threshold distributions of memory cells.

Next, a description will be given of threshold distributions of memory cell transistors MT. FIG. 5 is a schematic diagram illustrating threshold distributions of memory cell transistors MT. Each memory cell transistor MT can hold data of two or more bits. In the present embodiment, reference will be made to the case where memory cell transistor MT holds 3-bit data, namely, so-called TLC (triple level cell) system.

The 3-bit data is defined by an upper bit, a middle bit and a lower bit. Where memory cell transistor MT stores 3-bit data, memory cell transistor MT has one of the eight threshold voltages described below. The eight threshold voltages will be referred to as "Er", "A", "B", "C", "D", "E", "F" and "G" levels in the ascending order. The memory cell transistors MT corresponding to the "Er", "A", "B", "C", "D", "E", "F" and "G" levels form threshold distributions.

For example, "111" data, "110" data, "100" data, "000" data, "010" data, "011" data, "001" data and "101" data are assigned to the threshold distributions of the "Er", "A", "B", "C", "D", "E", "F" and "G" levels, respectively. How data are assigned to the threshold distributions can be optionally determined.

In order to identify the data stored in the memory cell transistor MT to be read, the level of the threshold voltage of the memory cell transistor MT is determined. For this level determination, read voltages VA, VB, VC, VD, VE, VF and VG are used.

The "Er" level corresponds to, for example, a data erase state. The threshold voltage of memory cell transistor MT of the "Er" level is lower than voltage VA and has a negative value, for example.

The "A" level to the "G" level correspond to a state in which charges are injected into the charge storage layer and data is written in memory cell transistor MT. The threshold voltages of memory cell transistors MT included in the distributions have positive values, for example. The threshold voltage included in the "A" level is higher than read voltage VA and not higher than read voltage VB. The threshold voltage included in the "B" level is higher than read voltage VB and not higher than read voltage VC. The threshold voltage included in the "C" level is higher than read voltage VC and not higher than read voltage VD. The threshold voltage included in the "D" level is higher than read voltage VD and not higher than read voltage VE. The threshold voltage included in the "E" level is higher than read voltage VE and not higher than read voltage VF. The threshold voltage included in the "F" level is higher than read voltage VF and not higher than read voltage VG. The threshold voltage included in the "G" level is higher than read voltage VG and not higher than voltage VREAD. Voltage VREAD is a voltage applied to the word line WL connected to the memory cell transistor MT of the cell unit CU which is not to be read. Voltage VREAD is higher than the threshold voltages of the memory cell transistors MT of any level. That is, the memory cell transistor MT whose control gate is applied with voltage VREAD is in the ON state without reference to the data it holds.

As described above, each memory cell transistor MT can take eight states by having one of the eight threshold voltage distributions. Data write and data read are performed in units of pages of one cell unit CU. Where memory cell transistor MT stores 3-bit data, a lower bit, a middle bit and an upper bit are assigned to the three pages of one cell unit CU. In the description below, the pages that are collectively written or read using the lower bit, middle bit and upper bit will be referred to as a lower page, a middle page and an upper page, respectively.

[1-1-5] Configurations of Sense Amplifier Unit 28 and Data Register 29

Figure 6:
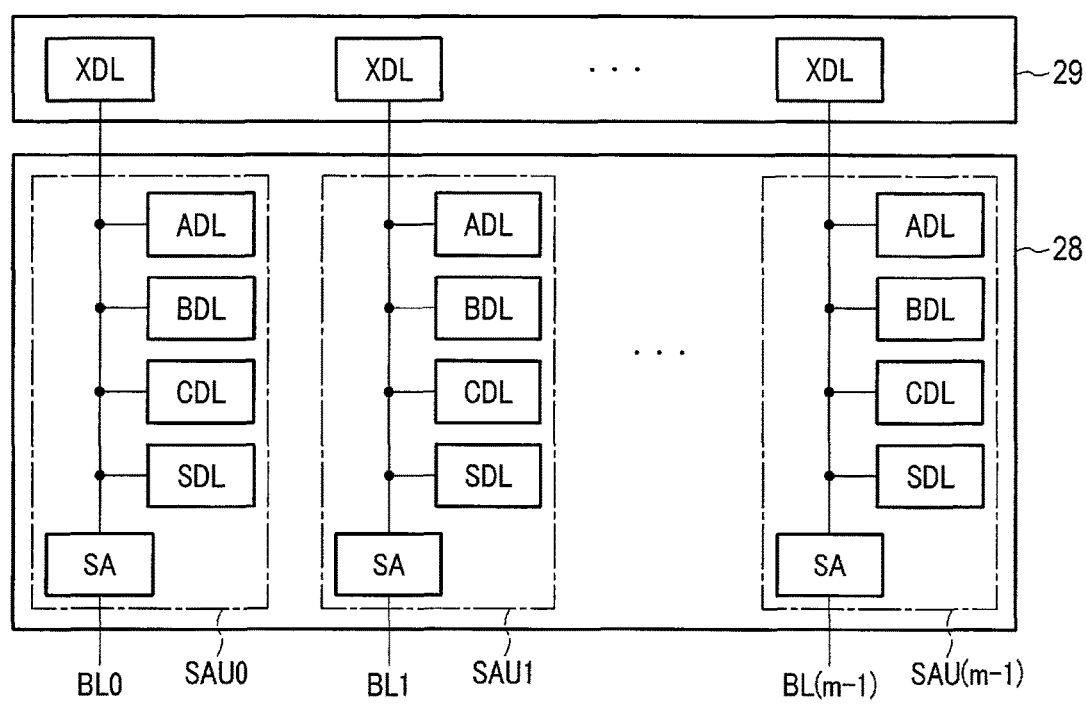
FIG. 6 is a block diagram of a sense amplifier unit and a data register which are shown in FIG. 2.

FIG. 6 is a block diagram showing the sense amplifier unit 28 and data register 29 depicted in FIG. 2.

The sense amplifier unit 28 is provided with sense amplifier units SAU0 to SAU(m−1) corresponding to the bit lines BL0 to BL(m−1), respectively. Each sense amplifier unit SAU includes a sense amplifier SA and data latch circuits SDL, ADL, BDL and CDL. The sense amplifier SA and data latch circuits SDL, ADL, BDL and CDL are connected together such that data can be transferred to and from each other.

Data latch circuits SDL, ADL, BDL and CDL temporarily hold data. When a write operation is performed, the sense amplifier SA controls the voltage of the bit line BL in accordance with the data held in data latch circuit SDL. Data latch circuits ADL, BDL and CDL are employed for enabling multi-value actions in which memory cell transistor MT holds data of two or more bits. That is, data latch circuit ADL is used for holding a lower page. Data latch circuit BDL is used for holding a middle page. Data latch circuit CDL is used for holding an upper page. The number of data latch circuits provided for sense amplifier unit SAU can be optionally determined in accordance with the number of bits held by one memory cell transistor MT.

At the time of read operation, the sense amplifier SA senses data read to the corresponding bit line BL and determines whether the data is "0" data or "1" data. At the time of write operation, the sense amplifier SA applies a voltage to the bit line BL, based on the write data.

The data register 29 is provided with data latch circuits XDL, the number of which corresponds to the number of sense amplifier units SAU0 to SAU(m−1). The data latch circuits XDL are connected to the input/output circuit 21. The data latch circuits XDL temporarily hold write data supplied from the input/output circuit 21, and temporarily hold read data supplied from the sense amplifier units SAU. To be more specific, the data transfer between the input/output circuit 21 and the sense amplifier units 28 is performed via data latch circuits XDL corresponding to one page. Write data received by the input/output circuit 21 is transferred to one of data latch circuits ADL, BDL and CDL via the corresponding data latch circuit XDL. Read data read by sense amplifier SA is transferred to the input/output circuit via the corresponding data latch circuit XDL.

[1-2] Operation

Next, an operation of the memory system 1 having the above configurations will be described.

The NAND flash memory 2 has the function of suspending a write operation when the memory controller 3 issues a read command during the execution of the write operation and of resuming the write operation after the read operation corresponding to the read command is executed.

The write operation includes a program operation and a verify operation. In the write operation, a program loop including the program operation and the verify operation is repeated a number of times.

The program operation is an operation of increasing the threshold voltage of memory cell transistor MT by injecting charges (electrons) into the charge storage layer of memory cell transistor MT or an operation of maintaining the threshold voltage of memory cell transistor MT by inhibiting the injection of electrons into the charge storage layer. The operation of increasing the threshold voltage is referred to as "0" write, and the operation of maintaining the threshold voltage is referred to as "1" write or write inhibition. To be more specific, the voltage applied to bit line BL differs between the "0" write and the "1" write. For example, a ground voltage VSS is applied to the bit line BL corresponding to the "0" write. For example, a power supply voltage VDD (>VSS) is applied to the bit line BL corresponding to the "1" write.

The verify operation is an operation of reading the data in memory cell transistor MT after the program operation and determining whether or not the threshold voltage of memory cell transistor MT reaches the target level. The case where the threshold voltage of memory cell transistor MT reaches the target level will be referred to as "verify pass", and the case where the threshold voltage does not reach the target level will be referred to as "verify fail."

[1-2-1] Re Creep-Up of Word Line WL

In the memory cell array 20 of the three-dimensional structure, the channel region of memory cell transistor MT is not directly connected to the substrate (or the well region) but is connected to bit line BL and the substrate via select transistors ST1 and ST2. Therefore, if select transistors ST1 and ST2 are cut off, the charges in the channel region cannot easily move to bit line BL or the substrate but slowly flow as a leak current of select transistors ST1 and ST2.

Figure 7:
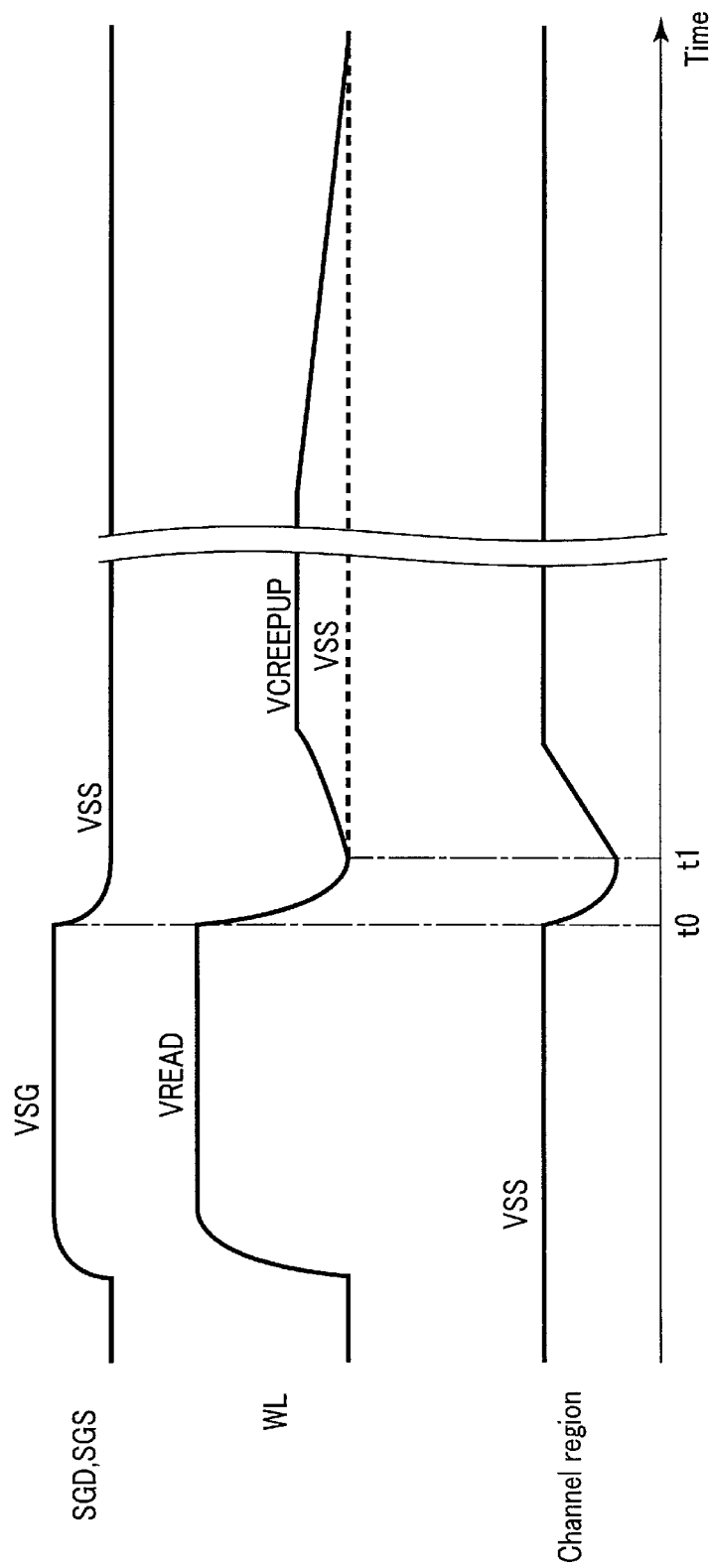
FIG. 7 is a drawing illustrating how WL creep-up is.

In the present embodiment, the phenomenon in which the voltage of word line WL increases due to the capacitive coupling between the channel region of memory cell transistor MT (or the channel region of NAND string NS) and word line WL, will be referred to as "WL creep-up." FIG. 7 is a drawing illustrating the WL creep-up.

By way of example, let us assume that at a given point of time, the channel region is at ground voltage VSS (0V), word line WL is at voltage VREAD, and select gate lines SGD and SGS are at voltage VSG. The details of the exemplified voltages will be described later. Subsequently, at time to, an operation ends, and the voltages of word line WL and select gate lines SGD and SGS decrease to ground voltage VSS. In this case, the potential of the channel region decreases and becomes negative (time t1) due to the capacitive coupling between word line WL and the channel region. Thereafter, the charges of the channel region gradually flow to the substrate and/or bit line BL as a leak current, and the potential of the channel region increases to ground voltage VSS again. As a result, the voltage of word line WL capacitively coupled with the channel region increases to creep-up voltage VCREEPUP (e.g., 4V). After creeping up, the voltage of word line WL gradually decreases due to the leak current of the transistor that drives word line WL.

Figures 8, 9:
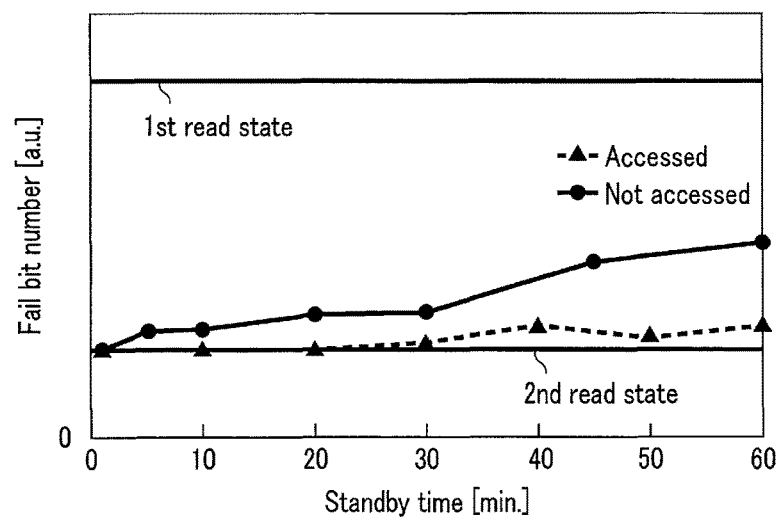
FIG. 8 is a drawing illustrating how the creep-up state of a block BLK is after a program operation and a read operation.
FIG. 9 is a graph illustrating relationships between a fail bit number and a standby time.

The state in which word line WL does not creep up will be referred to as "1st read state" (or "1st access state"), and the state in which word line WL creeps up will be referred to as "2nd read state" (or "2nd access state"). FIG. 8 is a drawing illustrating how the creep-up state of block BLK is after a program operation and a read operation. How the creep-up state transitions differs between the program operation and the read operation.

Block BLK for which the program operation is performed assumes the 2nd read state immediately after the program operation (for example, 100 µs to 10 ms after the program operation), assumes the 1st read state, for example, 100 µs to 10 ms thereafter, and continues to be in the 1st read state, for example, several minutes to several tens of minutes thereafter. If the channel is in the boost state in many memory cell transistors MT, word line WL does not easily creep up. That is, since the channel is boosted during the program operation, the creep-up is hard to occur after the program operation.

Block BLK for which the read operation is performed assumes the 2nd read state immediately after the read operation (for example, 100 µs to 10 ms after the read operation), assumes the 2nd read state, for example, 100 µs to 10 ms thereafter, and assumes the 1st read state, for example, several minutes to several tens of minutes thereafter. That is, the 2nd read state can last long when the read operation is executed for block BLK.

The threshold distributions of memory cell transistors MT are shifted between block BLK in the 1st read state and block BLK in the 2nd read state. That is, read results may be different between the case where a read operation is performed for block BLK in the 1st read state and the case where the read operation is performed for block BLK in the 2nd read state. By way of experiment, let us consider the case where the 1st read state transitions to the 2nd read state. In this case, the threshold distribution of memory cell transistor MT in the low-level state is shifted up and the threshold distribution of memory cell transistor MT in the high-level state is shifted down.

This phenomenon occurs when a suspend is executed. Therefore, in order to suppress the shifting of the threshold distribution of memory cell transistor MT, it is preferable that block BLK be kept in the 2nd read state during the suspend. From FIG. 8, it can be understood that block BLK can be kept in the 2nd read state by performing a read operation for that block every several minutes. In principle, a read operation is similar to a verify operation.

FIG. 9 is a graph illustrating relationships between a fail bit number and a standby time. The ordinate axis of FIG. 9 represents a fail bit number (arbitrary unit: a.u.) and the abscissa axis thereof represents a standby time (min.). The standby time is a period between the end of a 1st read and the start of a 2nd read.

FIG. 9 is a graph illustrating the 1st read state and the 2nd read state. In the graph shown in FIG. 9, the case where block BLK in the 2nd read state is accessed and the case where block BLK in the 2nd read state is not accessed are shown. The "accessed case" is intended to mean that a target block BLK is accessed, for example, by reading data from the target block BLK. In the accessed case, access is performed every ten minutes, for example.

In the non-accessed case, the fail bit number increases in accordance with an increase in the standby time. On the other hand, the fail bit number is prevented from increasing by performing access (read) every ten minutes. That is, it can be understood that block BLK can be kept in the 2nd read state by performing a read operation for that block BLK at the intervals of predetermined times.

In the present embodiment, where the suspend mode is set after the program operation, selected block BLK is kept in the 2nd read operation during the suspend mode. By so doing, the NAND flash memory 2 is improved in reliability.

[1-2-2] Write Operation

Figure 10:
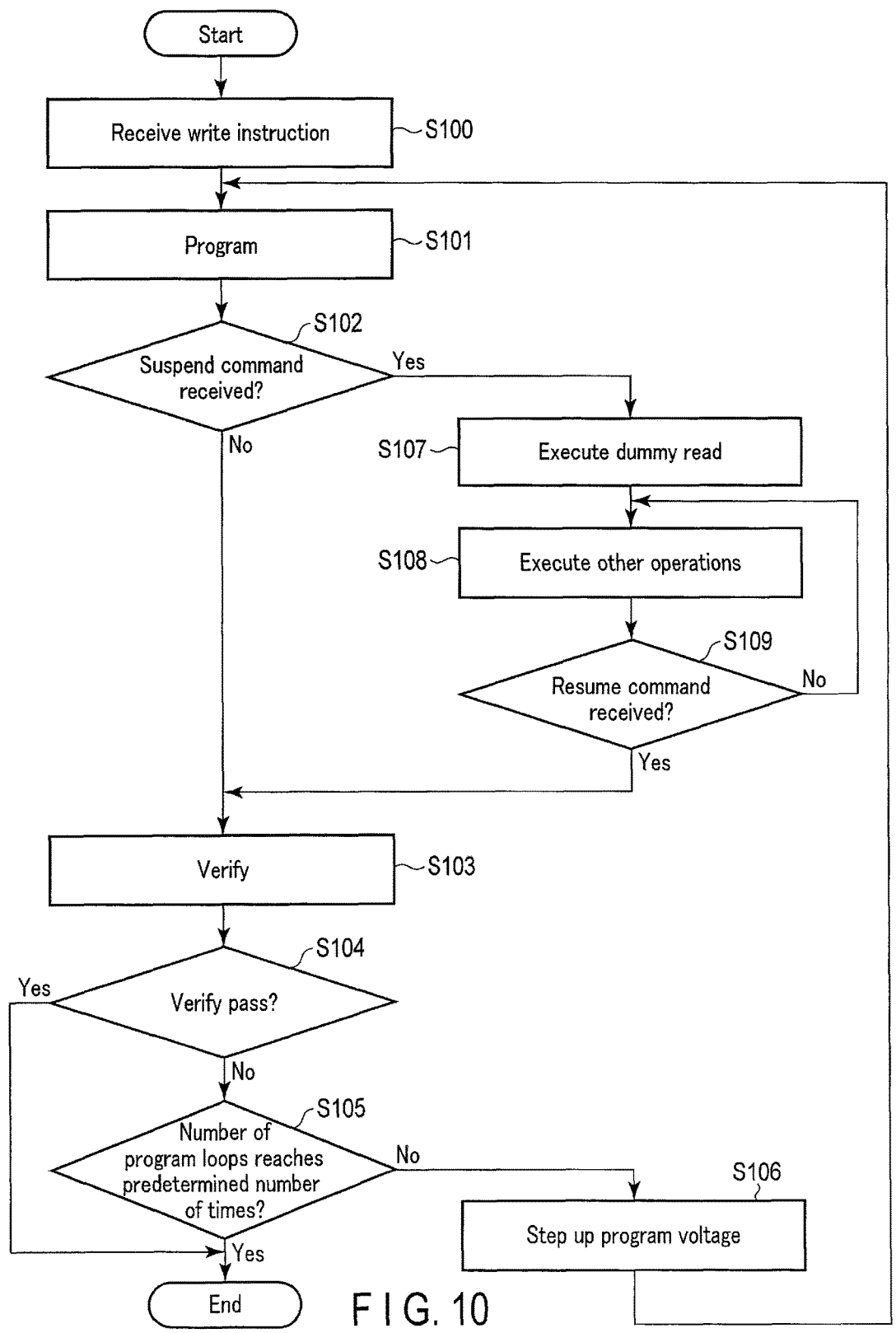
FIG. 10 is a flowchart illustrating a write operation performed by the NAND flash memory of the first embodiment.

FIG. 10 is a flowchart illustrating a write operation performed by the NAND flash memory 2 of the first embodiment.

The NAND flash memory 2 receives a write instruction from the memory controller 3 (step S100). The write instruction includes a write command, an address and data.

Subsequently, the control circuit 24 starts a program operation (step S101). Then, the control circuit 24 monitors whether a suspend command is received from the memory controller 3 (step S102). If the suspend command is not received during the program operation (step S102=No), the control circuit 24 executes a verify operation as usual (step S101).

Where the verify operation of the cell unit CU connected to a selected word line successfully passes (step S104=Yes), the control circuit 24 ends the write operation. The verify operation of cell unit CU is regarded as passing when the threshold voltages of all memory cell transistors MT included in cell unit CU reach the target levels, or when the number of cells which are included in the memory cell transistors MT of cell unit CU and which do not pass the verify operation becomes less than a predetermined value. In other words, the control circuit 24 counts the number of bits (the number of memory cell transistors) which fail in the verify operation, and if the fail bit number is less than a predetermined number, the control circuit 24 may determine that the verify operation of cell unit CU successfully passes.

On the other hand, if the verify operation fails (step S104=No), the control circuit 24 determines whether the number of program loops has reached a predetermined number of times (step S105). Where the number of program loops has not yet reached the predetermined number of times (step S105=No), the control circuit 24 steps up the program voltage by a predetermined step-up voltage (step S106). Then, the control circuit 24 repeatedly executes the operation of step S101 and its subsequent operations.

Where the number of program loops has reached the predetermined number of times (step S105=Yes), the control circuit 24 ends the write operation. Then, the control circuit 24 notifies the memory controller 3 that the write operation does not end normally.

If, in step S102, the suspend command is received during the program operation (step S102=Yes), the control circuit 24 executes a dummy read operation (step S107). The dummy read operation is not an operation for reading data but an operation for keeping selected block BLK in the 2nd read state. In the present embodiment, for example, an SLC (single level cell) read operation is used as the dummy read operation. In the SLC read operation, a read voltage for SLC is applied to a given word line WL, and 1-bit data stored in memory cell transistor MT is read. The data read in the dummy read operation is not used, and an accurate read operation is not necessary. The control circuit 24 does not externally output the data read in the dummy read operation. By using the SLC read operation as the dummy reading operation, selected block BLK is kept in the 2nd read state and the dummy read operation can be performed at high speed.

Subsequently, the control circuit 24 executes other operations related to the suspend command (i.e., operations other than the ongoing write operation) (step S108). "Other operations" include a read operation for another block BLK.

Subsequently, the control circuit 24 monitors whether a resume command is received (step S109). When a resume command is received, the control circuit 24 ends the operation of step S108. Subsequently, the control circuit 24 executes a verify operation in step S103.

[1-2-3] Details of Write Operation

Figure 11:
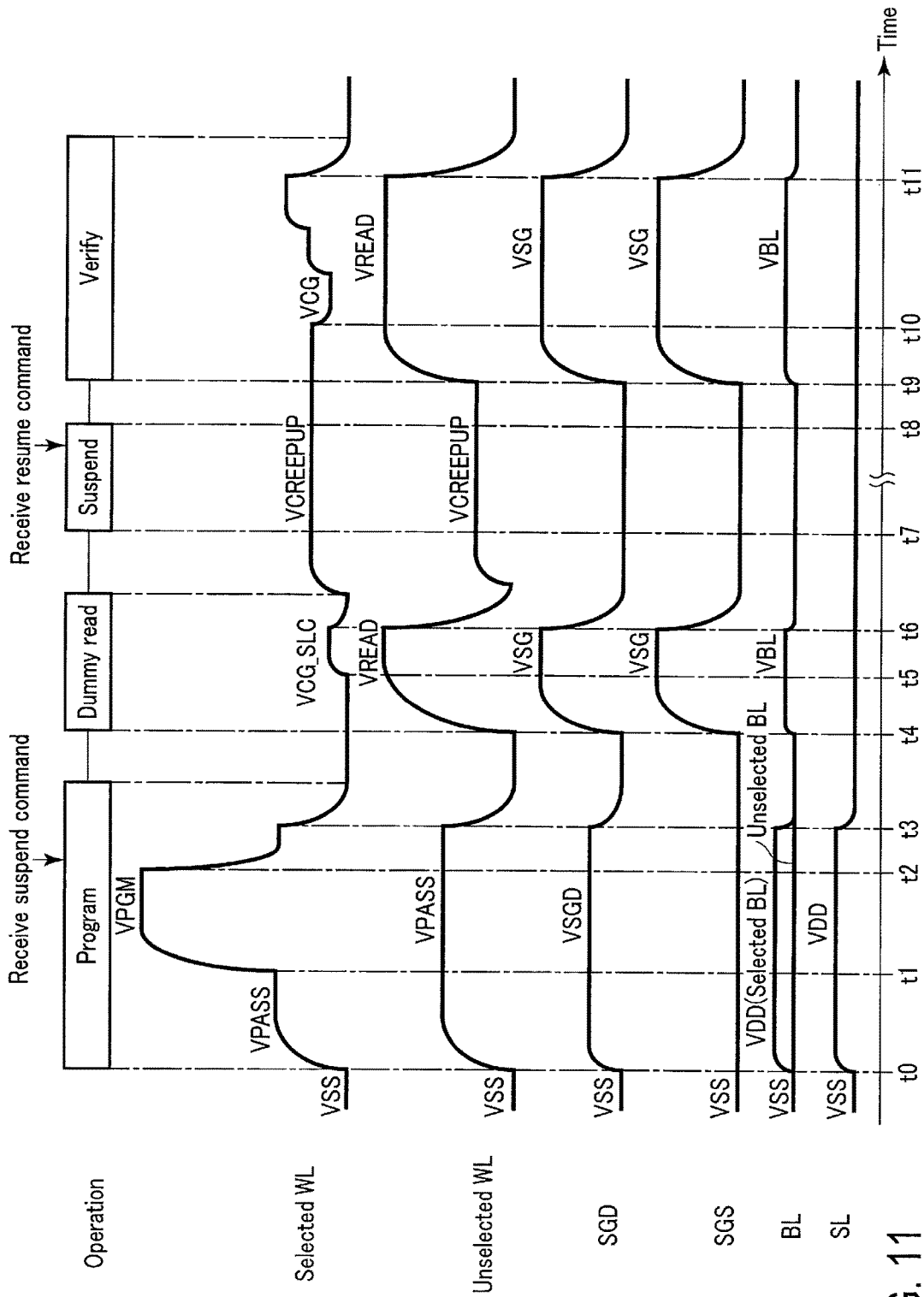
FIG. 11 is a timing chart illustrating a write operation performed by the NAND flash memory of the first embodiment.

A description will now be given of details of a write operation. FIG. 11 is a timing chart illustrating a write operation performed by the NAND flash memory 2 of the first embodiment. FIG. 11 shows rough waveforms, and a detailed operation such as an operation of pre-charging a channel before the application of a program voltage is not illustrated.

First of all, the control circuit 24 executes a program operation. At time t0, the row decoder 26 applies voltage VPASS to all word lines WL of a target block BLK. Also, the row decoder 26 applies voltage VSGD to selected gate line SDG and applies voltage VSS to selected gate line SGS. The sense amplifier unit 28 applies voltage VSS to selected bit line BL (program target bit line) and applies a voltage higher than voltage VSS, for example, power supply voltage VDD (e.g., 3V), to nonselected bit line BL (program inhibition bit line). For example, power supply voltage VDD is applied to source line SL. Voltage VPASS is a voltage which turns on memory cell transistor MT without reference to the threshold voltage of memory cell transistor MT and which prevents an erroneous write operation from being performed for nonselected memory cell transistor MT. Voltage VSGD is a voltage which turns on select transistor ST1 connected to selected bit line BL and which cuts off select transistor ST1 connected to nonselected bit line BL.

At time t1, the row decoder 26 applies program voltage VPGM (>VPASS) to selected word line WL. As a result, in memory cell transistor MT for which a write operation is to be performed, the voltage difference between word line WL and the channel increases, and the threshold voltage of memory cell transistor MT increases. On the other hand, in memory cell transistor MT for which a write operation is inhibited, the voltage difference between word line WL and the channel does not increase, and variations of the threshold voltage of memory cell transistor MT are suppressed. After times t2 and t3, voltage VSS is applied to the interconnect layers mentioned above.

Let us assume here that the control circuit 24 receives a suspend command from the memory controller 3 during the program operation. Then, the control circuit 24 executes a dummy read operation. That is, at time t4, the row decoder 26 applies voltage VREAD to nonselected word line WL. Also, the row decoder 26 applies voltage VSG to selected gate lines SDG and SGS. The sense amplifier unit 28 applies voltage VBL to bit lines BL. Voltage VSS is applied to source line SL. Voltage VSG is a voltage high enough to turn on select transistors ST1 and ST2. Voltage VBL is a voltage higher than voltage VSS.

At time t5, the row decoder 26 applies voltage VCG SLC to selected word line WL. Voltage VCG SLC is a read voltage for SLC. Since the data read in the dummy read operation is not used, voltage VCG SLC can be freely determined as long as it is a voltage lower than voltage VREAD. In addition, selected word lines to which voltage VCG SLC is applied can be freely determined. At time t6, voltage VSS is applied to the interconnect layers mentioned above.

In the dummy read operation, voltage VREAD may be applied to all word lines WL of selected block BLK. Although voltage VBL is applied to bit lines BL in the dummy read operation, this is not restrictive. A voltage lower than voltage VBL may be applied to bit lines BL. In addition, voltage VSS may be applied to bit lines BL. By lowering the voltage applied to bit lines BL, the dummy operation can be performed at high speed, and the power consumption in the dummy operation can be reduced.

At time t7, the control circuit 24 enters into the suspend mode (suspend period), and other operations related to the suspend are executed. In the present embodiment, the dummy read operation is executed prior to the entry into the suspend mode. In the suspend period, therefore, all word lines WL of selected block BLK are nearly at the creep-up voltage VCREEPUP.

When a resume command is received from the memory controller 3 in the suspend mode, the control circuit 24 ends the suspend mode (time t8).

Subsequently, after the end of the suspend mode, the control circuit 24 executes a verify operation corresponding to the program operation executed prior to the suspend mode. That is, at time t9, the row decoder 26 applies voltage VREAD to nonselected word line WL. Also, the row decoder 26 applies voltage VSG to selected gate lines SDG and SGS. The sense amplifier unit 28 applies voltage VBL to bit lines BL. Voltage VSS is applied to source line SL.

At time t10, the row decoder 26 applies voltages VCG of different levels to selected word line WL in succession. Although FIG. 11 shows three verify voltages, the verify voltages actually applied in succession are determined in accordance with the number of verify levels. Thereafter, at time t11, voltage VSS is applied to the interconnect layers mentioned above.

Subsequently, a program loop including the program operation and the verify operation is repeated a number of times.

The sequences shown in FIG. 10 and FIG. 11 may be automatically executed by the NAND flash memory 2; alternatively, they may be executed by the memory controller 3 which controls the operation of the NAND flash memory 2. This holds true for the other embodiments as well.

[1-3] Advantages of First Embodiment

As detailed above, according to the present embodiment, when the control circuit 24 receives a suspend command for instructing an operation suspend during execution of a program operation from an external device (memory controller 3), the control circuit 24 executes a dummy read operation, by which a voltage is applied to a plurality of word lines of a target block BLK after the program operation. After the dummy read operation, the control circuit 24 enters into the suspend mode. Immediately after the end of the suspend mode, the control circuit 24 executes a verify operation.

According to the first embodiment, therefore, the 2nd read state (2nd access state) can be maintained during the suspend period. In other words, the state where the suspend mode is executed after the verify operation can be created in a pseudo manner. As a result, the variation of the threshold voltage of memory cell transistor MT can be suppressed when the operation returns from the suspend mode. As a result, the NAND flash memory 2 can be improved in reliability.

In addition, the dummy read operation is performed in a similar manner to that of the SLC read operation, in which 1-bit data is read from memory cell transistor MT. As a result, since the time required for the dummy read operation can be shortened, the read operation does not take long.

In the dummy read operation, bit lines BL are applied with a voltage lower than voltage VBL used in the normal read operation. As a result, the power consumption in the dummy read operation can be reduced.

[2] Second Embodiment

According to the second embodiment, all word lines WL of selected block BLK are directly applied with creep-up voltage VCREEPUP during the suspend period.

Figure 12:
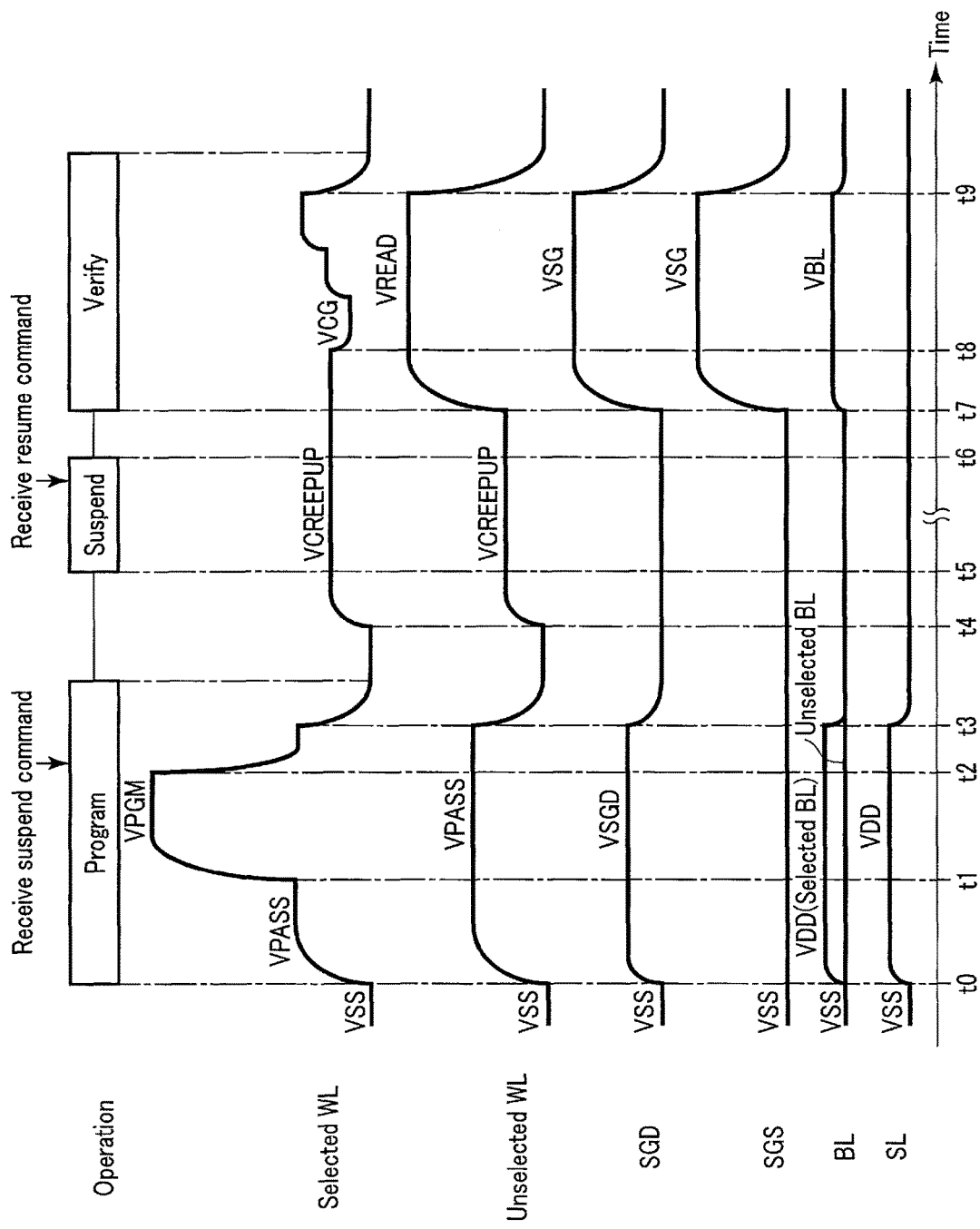
FIG. 12 is a timing chart illustrating a write operation performed by a NAND flash memory according to the second embodiment.

FIG. 12 is a timing chart illustrating a write operation performed by the NAND flash memory 2 of the second embodiment. Let us assume that the control circuit 24 receives a suspend command during the program operation, as in the case shown in FIG. 11.

Subsequently, at time t4, the row decoder 26 applies creep-up voltage VCREEPUP (e.g., 4V) to all word lines WL of selected block BLK. Since the creep-up voltage VCREEPUP varies depending upon the configuration and characteristics of the memory cell array 20, a voltage whose value is measured in advance is used. The creep-up voltage CREEPUP is higher than ground voltage VSS and is lower than voltage VREAD. The voltage generator 25 and the row decoder 26 are configured such that they enable supply of the creep-up voltage VCREEPUP.

At time t5, the control circuit 24 enters into the suspend mode, and other operations related to the suspend are executed. The subsequent operations are similar to those shown in FIG. 11.

According to the second embodiment as well, all word lines WL of selected block BLK are applied with creep-up voltage VCREEPUP during the suspend period. As a result, the variation of the threshold voltage of memory cell transistor MT can be suppressed when the operation returns from the suspend mode. As compared with the first embodiment, the second embodiment is advantageous in that the write operation including the suspend can be as short as possible.

[3] Third Embodiment

According to the third embodiment, when the program operation switches to the suspend mode, the voltage applied to all word lines WL of selected block BLK is not temporarily lowered to ground voltage VSS but the voltage applied to all word lines WL is continuously lowered to creep-up voltage VCREEPUP.

FIG. 13 is a timing chart illustrating a write operation performed by the NAND flash memory 2 of the third embodiment. Let us assume that the control circuit 24 receives a suspend command during the program operation, as in the case shown in FIG. 11.

Subsequently, at time t3, the row decoder 26 decreases the voltage applied to all word lines WL of selected block BLK such that the voltage continuously decreases from voltage VREAD to creep-up voltage VCREEPUP.

At time t4, the control circuit 24 enters into the suspend mode, and other operations related to the suspend are executed. The subsequent operations are similar to those shown in FIG. 11.

According to the third embodiment as well, all word lines WL of selected block BLK are applied with creep-up voltage VCREEPUP during the suspend period. As compared with the second embodiment, the third embodiment is advantageous in that the time required for the switching from the write operation to the suspend mode can be as short as possible. As a result, the write operation including the suspend can be as short as possible.

[4] Fourth Embodiment

In the fourth embodiment, a dummy read operation is executed after a suspend mode. After the voltage applied to all word lines WL of selected block BLK is changed to creep-up voltage VCREEPUP, a verify operation is executed.

FIG. 14 is a timing chart illustrating a write operation performed by the NAND flash memory 2 of the fourth embodiment. Let us assume that the control circuit 24 receives a suspend command during the program operation, as in the case shown in FIG. 11. Subsequently, from time t4 to time t5, the control circuit 24 enters into the suspend mode.

After returning from the suspend mode, the control circuit 24 executes a dummy read operation (t6 to t8) at time t6. Details of the dummy read operation are similar to those described in connection with the first embodiment.

After the dummy read operation, the control circuit 24 executes a verify operation (time t9 to time t11) corresponding to the program operation executed prior to the suspend mode. Details of the verify operation are similar to those described in connection with the first embodiment.

According to the fourth embodiment, all word lines WL of selected block BLK are not applied with creep-up voltage VCREEPUP during the suspend period. That is, selected block BLK is in the 1st read state. However, since the dummy read operation is executed before the verify operation, selected block BLK is set in the 2nd read state during the verify operation. As a result, the variation of the threshold voltage of memory cell transistor MT can be suppressed before the verify operation.

[5] Fifth Embodiment

If interrupt processing such as a read instruction is performed during a write operation, the write operation is suspended, and after the end of the interrupt processing the write operation is resumed. If the suspend mode is started during the write operation, the threshold distribution of memory cell transistor MT may expand. For example, if memory cell transistor MT for which a write operation is not completed is programmed at a verify level or thereabouts, the program operation is performed at the upper portion of the threshold distribution of memory cell transistor MT. This is one of the factors that cause the expansion of the threshold distribution. In the fifth embodiment, therefore, the program voltage applied immediately after the suspend mode is set to be lower than the voltage applied immediately before the suspend mode. In this manner, the variation amount of the threshold voltage can be reduced in the program operation executed after the suspend mode.

[5-1] Write Operation

Figure 15:
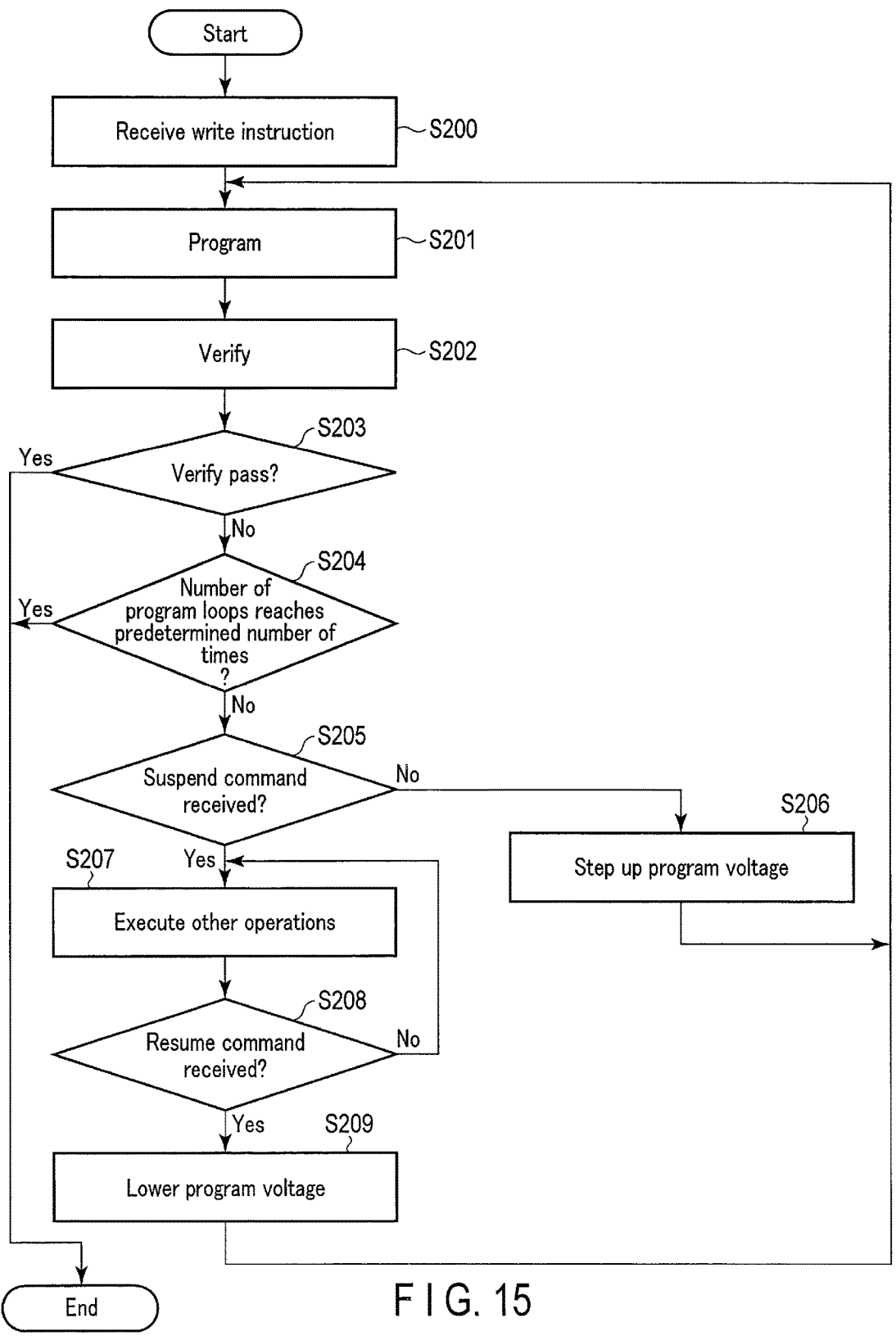
FIG. 15 is a flowchart illustrating a write operation performed by a NAND flash memory according to the fifth embodiment.

FIG. 15 is a flowchart illustrating a write operation performed by the NAND flash memory 2 of the fifth embodiment. FIG. 16 is a timing chart illustrating an example of the write operation performed by the NAND flash memory 2 of the fifth embodiment.

The NAND flash memory 2 receives a write instruction from the memory controller 3 (step S200). The write instruction includes a write command, an address and data.

Subsequently, the control circuit 24 executes a program operation (step S201). In the program operation, the row decoder 26 applies program voltage VPGM to selected word line WL. A specific operation of the program operation is similar to that described in connection with the first embodiment.

Subsequently, the control circuit 24 executes a verify operation (step S202). In the verify operation, the row decoder 26 applies read voltage (verify voltage) VCG to selected word line WL. A specific operation of the verify operation is similar to that described in connection with the first embodiment. Although FIG. 16 shows one kind of verify voltage VCG for the sake of simplicity, a plurality of verify voltages are actually applied in succession in accordance with the number of verify levels.

The verify operation of the cell unit CU connected to selected word line WL successfully passes (step S203=Yes), the control circuit 24 ends the write operation. On the other hand, if the verify operation fails (step S203=No), the control circuit 24 determines whether the number of program loops has reached a predetermined number of times (step S204). Where the number of program loops has reached the predetermined number of times (step S204=Yes), the control circuit 24 ends the write operation. Then, the control circuit 24 notifies the memory controller 3 that the write operation does not end normally.

Where the number of program loops has not yet reached the predetermined number of times (step S204=No), the control circuit 24 monitors whether a suspend command is received from the memory controller 3 (step S205). Where the suspend command is not received during the execution of the program loop (step S205=No), the control circuit 24 steps up program voltage VPGM by a predetermined step-up voltage nVPGM (step S206). Then, the control circuit 24 repeatedly executes the operation of step S201 and its subsequent operations, namely, the operations of the program loop.

Where the suspend command is received during the execution of the program loop (step S205=Yes), the control circuit 24 executes other operations related to the suspend command (i.e., operations other than the ongoing write operation) (step S207). "Other operations" include a read operation for another block BLK.

Subsequently, the control circuit 24 monitors whether a resume command is received (step S208). When the resume command is received, the control circuit 24 ends the operation of step S207. Subsequently, the control circuit 24 lowers the program voltage VPG (step S209). To be more specific, the control circuit 24 sets the program voltage such that the program voltage to be used in the program operation immediately after the suspend mode is lower than the program voltage used in the program operation executed immediately before the suspend mode. For example, the program voltage used immediately after the suspend mode is set to be lower than the program voltage immediately before the suspend mode by an integral multiple of step-up voltage $\Delta$VPGM (e.g., one multiple or two multiples).

Subsequently, the control circuit 24 returns to step S201 and executes a program operation, using the program voltage VPGM set in step S209. As shown in FIG. 16, the program voltage immediately after the suspend mode is lower than the program voltage immediately before the suspend mode. Thereafter, the program loop is repeated, with the program voltage being stepped up by step-up voltage $\Delta$VPGM.

[5-2] Advantages of Fifth Embodiment

According to the fifth embodiment, the threshold voltage is close to the verify level when the operation is returned from the suspend mode, and when a program operation is performed for memory cell transistor MT for which a write operation has not yet completed, the threshold voltage does not much vary. As a result, the threshold distribution is prevented from expanding in width. As a result, the NAND flash memory 2 can be improved in reliability.

[6] Sixth Embodiment

According to the sixth embodiment, the step-up voltage is decreased in accordance with the predetermined number of times the program loop is executed after the suspend mode.

Figure 17:
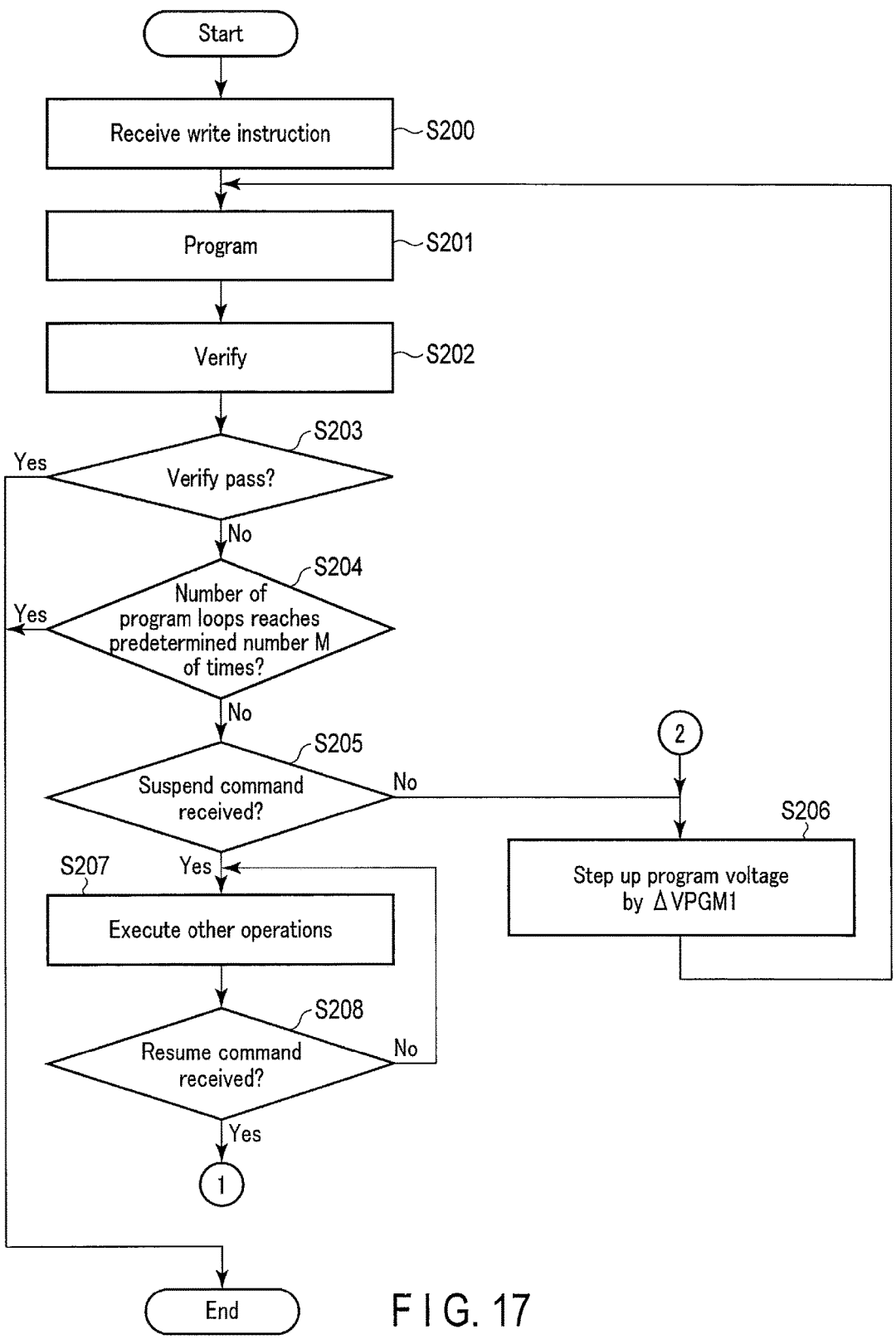
FIG. 17 is a flowchart illustrating a write operation performed by a NAND flash memory according to the sixth embodiment.
Figure 18:
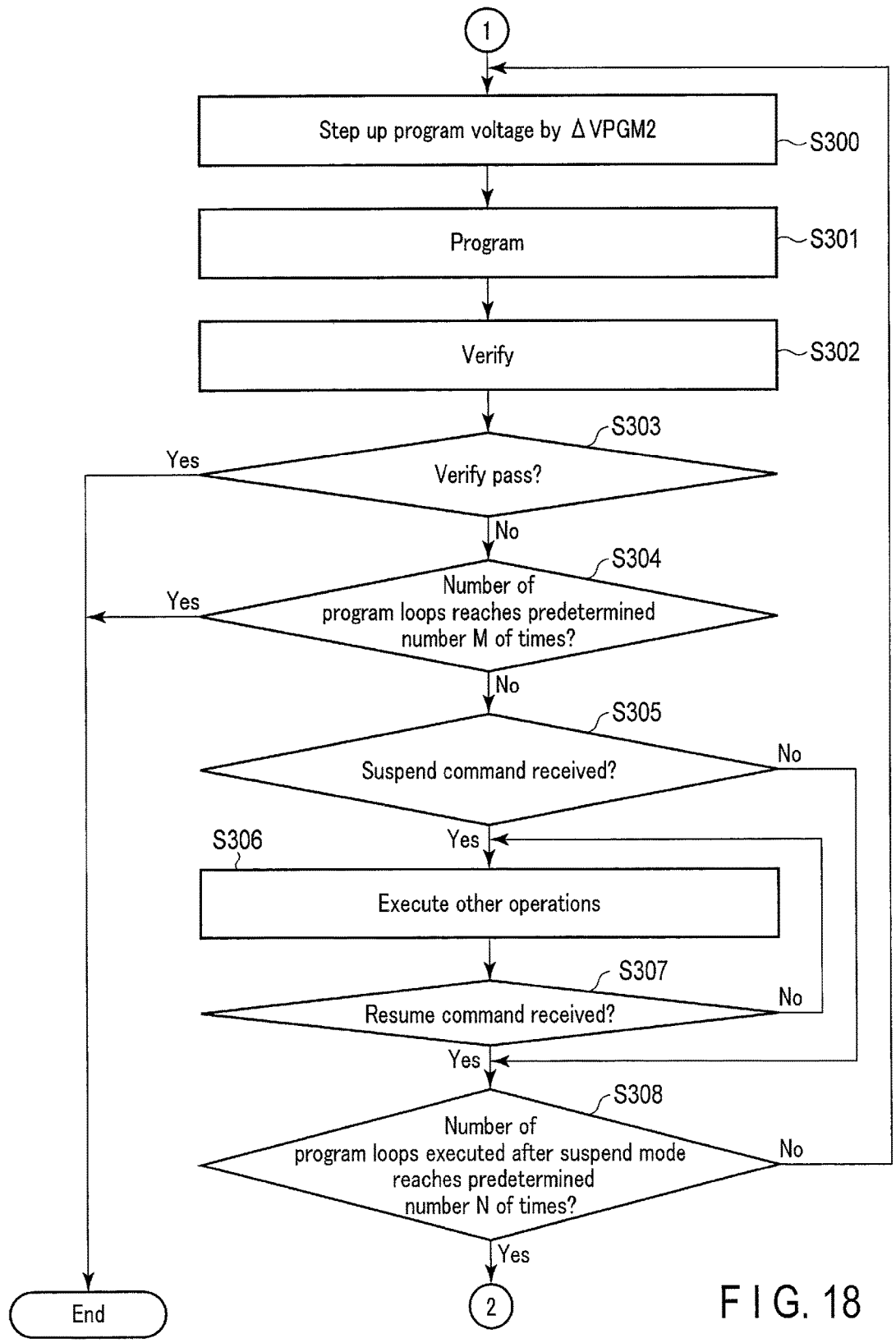
FIG. 18 is a flowchart illustrating a write operation performed by the NAND flash memory of the fifth embodiment.

FIG. 17 and FIG. 18 are flowcharts illustrating a write operation performed by the NAND flash memory 2 of the sixth embodiment. FIG. 19 is a timing chart illustrating an example of the write operation performed by the NAND flash memory 2 of the sixth embodiment.

In principle, the operations in steps 200 to S208 of FIG. 17 are similar to those explained in connection with the fifth embodiment. In step S204, the number of times the program loop should be executed is set to be M times. In step S206, the step-up voltage is set to be ΔVPGM1.

After the suspend mode, the control circuit 24 steps up the program voltage VPGM applied immediately before the suspend mode, by step-up voltage ΔVPGM2 (step S300). Step-up voltage ΔVPGM2 is smaller than ΔVPGM1.

Subsequently, the control circuit 24 executes a program operation, using the program voltage VPGM set in step S300 (step S301). Subsequently, the control circuit 24 executes steps S302 to S305. Steps S302 to S305 shown in FIG. 18 are similar to steps S202 to S205 shown in FIG. 17.

If a suspend command is not received during the program loop (step S305=No), the control circuit 24 determines whether the number of program loops executed after the suspend mode has reached a predetermined number N of times (step S308).

Where the number of program loops executed has not yet reached the predetermined number N of times (step S308=No), the control circuit 24 returns to step S300. In other words, according to the present embodiment, step-up voltage ΔVPGM2 is used in the program loop executed N times after the suspend mode.

For example, the predetermined number N of times is set in accordance with the magnitude of step-up voltage ΔVPGM2. Where step-up voltage ΔVPGM2 is set to be ½ of step-up voltage ΔVPGM1, voltage ΔVPGM2 becomes equal to ΔVPGM1 by stepping it up twice. In this case, after the program loop using step-up voltage ΔVPGM2 is executed twice (N=2), the program loop using step-up voltage ΔVPGM1 is executed again. Where step-up voltage ΔVPGM2 is set to be ⅓ of step-up voltage ΔVPGM1, voltage ΔVPGM2 becomes equal to ΔVPGM1 by stepping it up three times. In this case, after the program loop using step-up voltage ΔVPGM2 is executed three times (N=3), the program loop using step-up voltage ΔVPGM1 is executed again. FIG. 19 illustrates the case where step-up voltage ΔVPGM2 is set to be ⅓ of step-up voltage ΔVPGM1, namely the case where the program loop using step-up voltage ΔVPGM2 is executed three times (N=3).

Where the number of program loops executed after the suspend mode has reached the predetermined number N of times (step S308=Yes), the control circuit 24 steps up program voltage VPGM by step-up voltage ΔVPGM1 (step S206).

Where the suspend command is received in step S305, the control circuit 24 executes other operations related to the suspend command (step S306). When a resume command is received (step S307=Yes), the control circuit 24 moves on to step S308.

According to the sixth embodiment, after the operation is returned from the suspend mode, the step-up voltage is decreased during the program loop executed N times. As a result, the variation of the threshold voltage of memory cell transistor MT can be suppressed after the suspend mode. Hence, the threshold distribution is prevented from expanding in width.

[7] Seventh Embodiment

Figure 20:
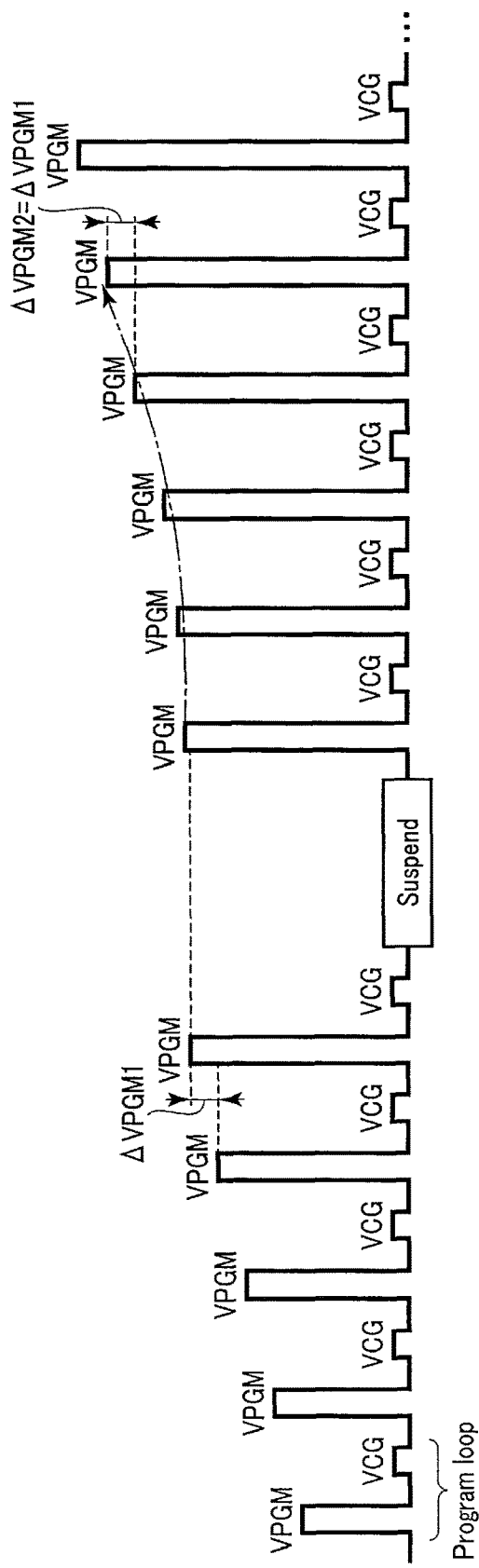
FIG. 20 is a timing chart illustrating an example of a write operation performed by a NAND flash memory according to the seventh embodiment.

FIG. 20 is a timing chart illustrating an example of the write operation performed by the NAND flash memory 2 of the seventh embodiment. According to the seventh embodiment, the control circuit 24 varies step-up voltage ΔVPGM2 used after the suspend mode. Immediately after the suspend mode, step-up voltage ΔVPGM2 is minimum, and step-up voltage ΔVPGM2 is gradually increased. Eventually, step-up voltage ΔVPGM2 is increased to ΔVPGM1 used before the suspend mode.

In the example shown in FIG. 20, step-up voltage ΔVPGM2 is increased each time a program loop is executed, and five step-up voltages ΔVPGM2 of different levels are used after the suspend mode. Eventually, step-up voltage ΔVPGM2 becomes equal to ΔVPGM1. The number of program loops using step-up voltage ΔVPGM2, which is the predetermined number N of times the program loop is executed, can be freely determined.

The seventh embodiment can produce the same advantages as the sixth embodiment. It should be noted that the seventh embodiment may be applied to the fifth embodiment.

[8] Eighth Embodiment

The eighth embodiment is an embodiment obtained by combining the fifth embodiment and the sixth embodiment with each other.

Figure 21:
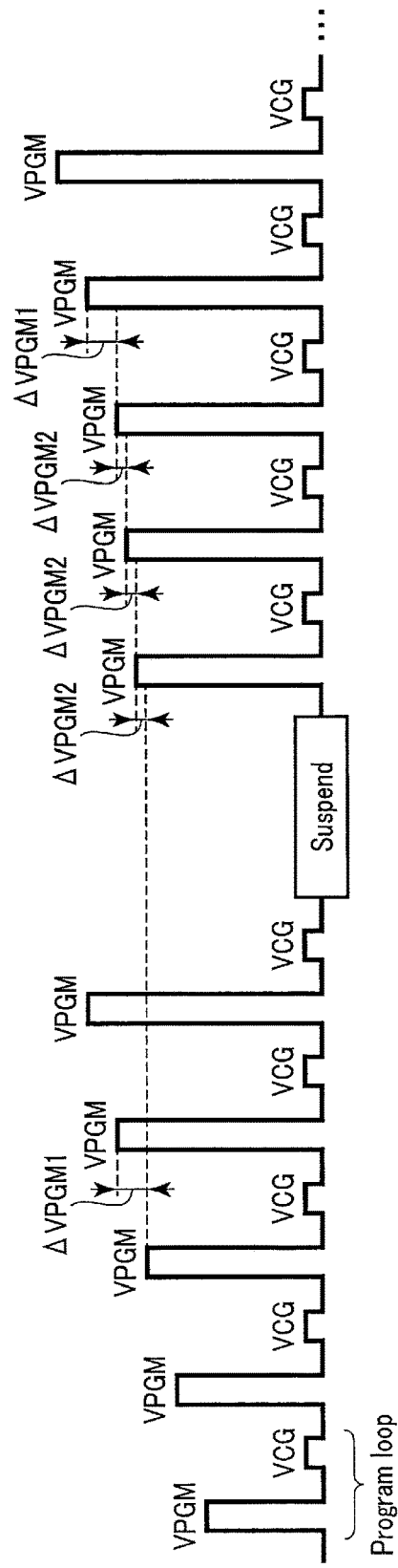
FIG. 21 is a timing chart illustrating an example of a write operation performed by a NAND flash memory according to the eighth embodiment.

FIG. 21 is a timing chart illustrating an example of the write operation performed by the NAND flash memory 2 of the eighth embodiment. In the eighth embodiment, the control circuit 24 controls program voltage VPGM such that program voltage VPGM used immediately after the suspend mode is lower than program voltage VPGM used immediately before the suspend mode. In addition, the control circuit 24 controls the step-up voltage such that step-up voltage ΔVPGM2 used in the program loop executed N times after the suspend mode is smaller than step-up voltage ΔVPGM1 used before the suspend mode.

According to the eighth embodiment, the variation of the threshold voltage of memory cell transistor MT can be suppressed after the suspend mode.

[9] Ninth Embodiment

According to the fourth embodiment, a program operation is not executed immediately after the suspend mode, but a verify operation is executed before the program operation. For memory cell transistors MT that fail in this verify operation, the following program loop is executed.

Figure 22:
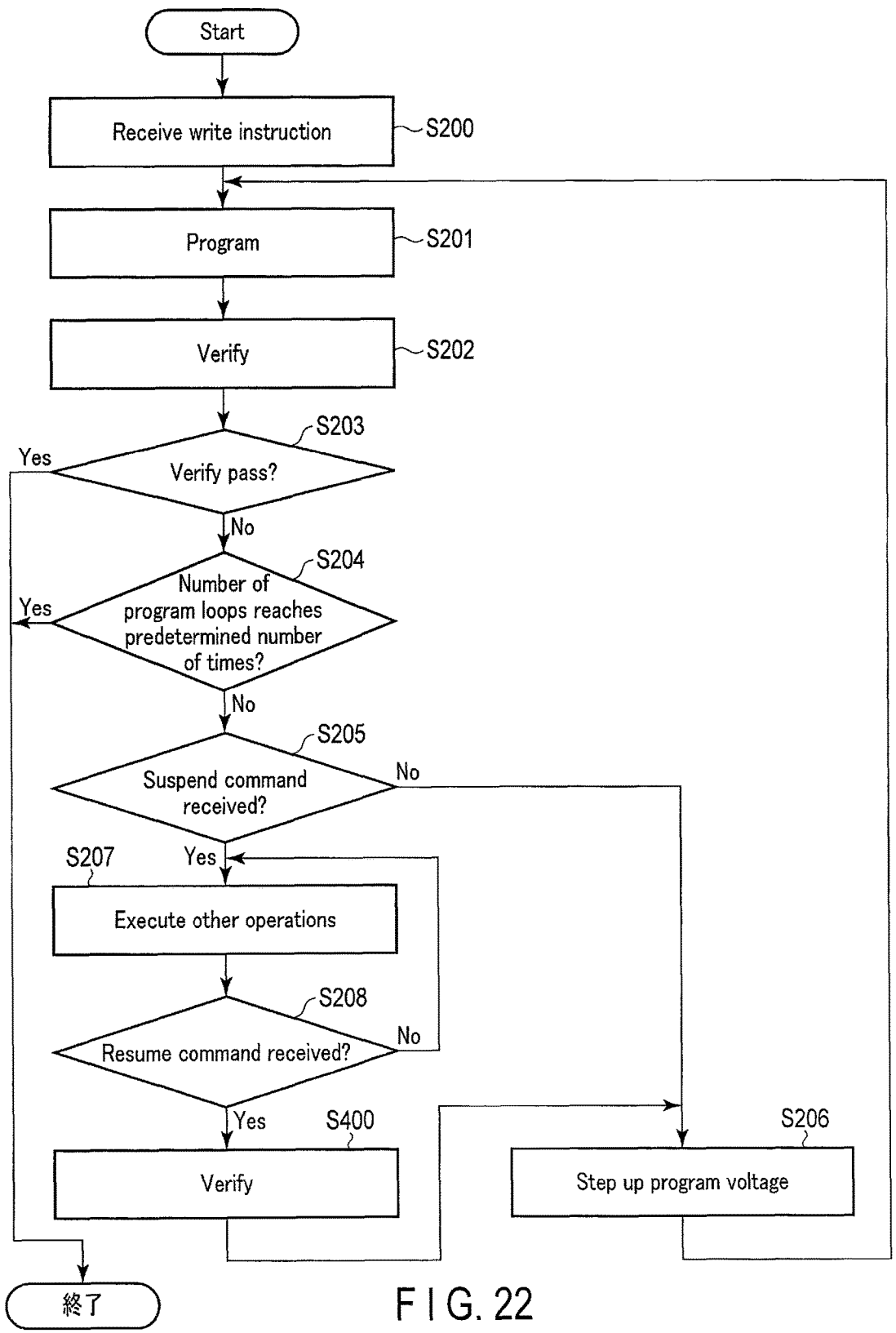
FIG. 22 is a flowchart illustrating a write operation performed by a NAND flash memory according to the ninth embodiment.

FIG. 22 is a flowchart illustrating a write operation performed by the NAND flash memory 2 of the ninth embodiment. The operations in steps 200 to S208 of the ninth embodiment are similar to those explained with reference to FIG. 15.

In step S208, a resume command is received, and after the end of the suspend mode, the control circuit 24 executes a verify operation (step S400). The verify operation of step S400 is similar to the verify operation of step S202.

Subsequently, the control circuit 24 steps up program voltage VPGM by predetermined step-up voltage ΔVPGM (step S206). Then, the control circuit 24 repeatedly executes the operation of step S201 and its subsequent operations, namely, the operations of the program loop.

According to the ninth embodiment, immediately after the suspend mode, a verify operation is first executed, and then the threshold voltage of memory cell transistor MT is determined again. Therefore, even if the threshold distribution of memory cell transistor MT varies during the suspend mode, a program operation can be executed in accordance with the threshold distribution taken after the suspend operation. As a result, the expansion of the threshold distribution of memory cell transistor MT can be suppressed.

[10] Tenth Embodiment

According to the tenth embodiment, the threshold voltage of memory cell transistor MT is slightly shifted in the negative direction after the suspend mode, and then a program operation is executed.

Figure 23:
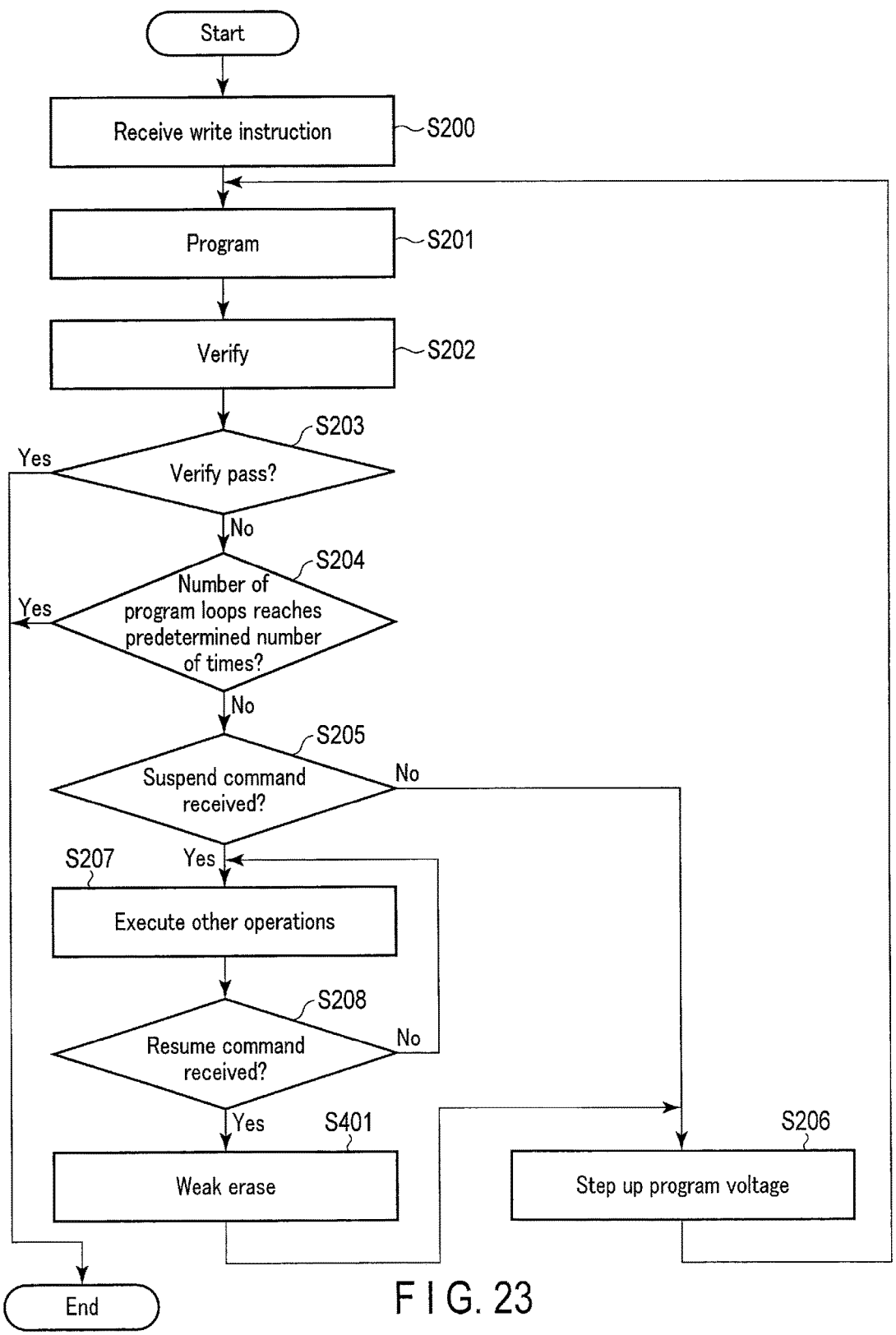
FIG. 23 is a flowchart illustrating a write operation performed by a NAND flash memory according to the tenth embodiment.

FIG. 23 is a flowchart illustrating a write operation performed by the NAND flash memory 2 of the tenth embodiment. The operations in steps 200 to S208 of the tenth embodiment are similar to those explained with reference to FIG. 15.

In step S208, a resume command is received, and after the end of the suspend mode, the control circuit 24 executes a weak erase operation (step S401). The weak erase operation is an operation of slightly shifting the threshold voltage of memory cell transistor MT in the negative direction.

Figure 24:
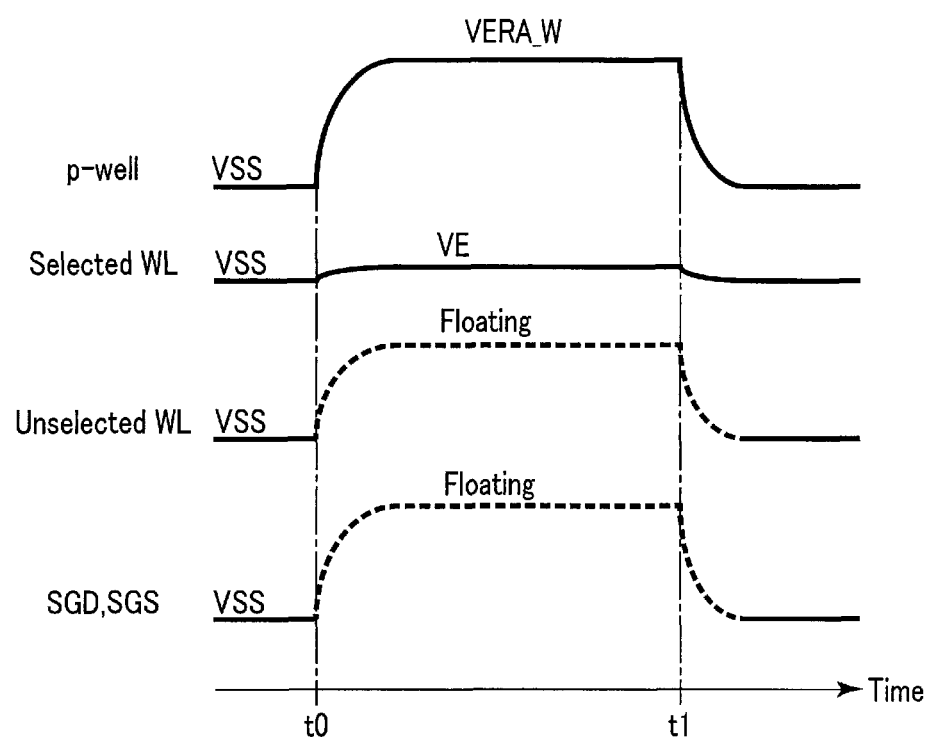
FIG. 24 is a timing chart illustrating a weak erase operation.

FIG. 24 is a timing chart illustrating the weak erase operation.

At time t0, the control circuit 24 applies weak erase voltage VERA_W to the p-type well region (p-well) 30 via well interconnect layer CPWELL. Weak erase voltage VERA_W is set to be lower than erase voltage VERA (e.g., 20V) used for the erase operation. The row decoder 26 applies voltage VE (e.g., 0.5V) to selected word line WL. The row decoder 26 also sets nonselected word line WL, selected gate line SGD and selected gate line SGS in the floating state. Bit line BL and source line SL are set in the floating state.

Under these voltage relationships, the voltage of the channel (semiconductor pillar 35) of the NAND string NS increases to voltage VERA_W or thereabouts. Therefore, in memory cell transistor MT connected to selected word line WL, part of the electrons in the charge storage layer are pulled by the semiconductor pillar 35, and the threshold voltage of memory cell transistor MT decreases. The variation amount of the threshold voltage can be properly determined by changing the magnitude of voltage VERA_W. Thereafter, at time t1, voltage VSS is applied to the interconnect layers mentioned above.

Turning back to FIG. 23, the control circuit 24 steps up program voltage VPGM by predetermined step-up voltage ΔVPGM (step S206). Then, the control circuit 24 repeatedly executes the operation of step S201 and its subsequent operations, namely, the operations of the program loop.

FIG. 25 is a schematic diagram illustrating how a program operation is performed after a weak erase operation. In FIG. 25, the curves indicated by the broken lines represent a desirable threshold distribution at a given level, and VR represents an arbitrary verify voltage.

As shown in (a) of FIG. 25, memory cell transistor MT whose threshold voltage is in the neighborhood of verify voltage VR may undergo threshold voltage shift. That is, the threshold voltage of that memory cell transistor MT may be greatly shifted as a result of a program operation executed after the suspend mode. As a result, the threshold distribution expands in width.

In contrast, according to the present embodiment, a weak erase operation is executed immediately after the suspend mode, as shown in (b) of FIG. 25. As a result, the threshold voltage of memory cell transistor MT is slightly shifted in the negative direction. After this, a program operation is executed as usual. Hence, the widthwise expansion of the threshold distribution can be suppressed.

According to the tenth embodiment, even if the threshold distribution of memory cell transistor MT varies during the suspend mode, the program operation executed after the suspend mode suppresses a marked increase in the threshold voltage of memory cell transistor MT. As a result, the expansion of the threshold distribution of memory cell transistor MT can be suppressed.

[11] Other Modifications

In connection with the embodiments described above, reference was made to the case where memory cell transistor holds 3-bit data, but this is not restrictive. For example, one memory cell transistor may hold 1-bit data (SLC: single level cell), may hold 2-bit data (MLC: multilevel cell), or may hold data of 4 bits or more. In such modifications as well, the operations described in connection with the above embodiments can be executed.

In connection with the above embodiments, reference was made to the case where a memory cell is formed of an MONOS film, but this is not restrictive. For example, a memory cell of floating gate type may be used.

While certain embodiments have been described, these embodiments have been presented by way of example only, and are not intended to limit the scope. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

What is claimed is:

1. A semiconductor memory device comprising:
   a memory cell array including a plurality of memory strings, each of the memory strings including a plurality of memory cells connected in series;
   a plurality of word lines commonly connected to the memory strings and connected to the memory cells; and
   a control circuit which executes a write operation including a plurality of program loops, each of the program loops including a program operation in which a program voltage is applied to a selected word line and a verify operation in which a threshold voltage of a memory cell is verified,
   wherein
   when a suspend command for instructing an operation suspend is externally received during execution of the program operation,
   the control circuit executes a dummy read operation in which the word lines are applied with a voltage after the program operation, and enters into a suspend mode after the dummy read operation.

2. The device according to claim 1, wherein the control circuit executes the verify operation immediately after end of the suspend mode.

3. The device according to claim 1, wherein, in the dummy read operation, the control circuit applies a first voltage to a first word line and applies a second voltage higher than the first voltage to a second word line other than the first word line.

4. The device according to claim 3, wherein the first voltage is a read voltage for an SLC (single level cell).

5. The device according to claim 1, wherein the control circuit applies an identical voltage to the word lines in the dummy read operation.

6. The device according to claim 1, further comprising:
   a plurality of bit lines connected to the memory strings,
   wherein each of the memory strings includes a first select transistor and a second select transistor which are connected to ends of the memory cells connected in series, the first select transistor is connected to one of the bit lines, the control circuit applies a third voltage to the bit lines in the dummy read operation, and the third voltage is lower than a voltage applied to the bit lines in a read operation.

7. The device according to claim 6, wherein the third voltage is a ground voltage.

8. The device according to claim 1, wherein the control circuit does not externally output data that is read in the dummy read operation.

9. The device according to claim 1, wherein the memory cells are stacked one upon another.

10. A semiconductor memory device comprising:
a memory cell array including a plurality of memory strings, each of the memory strings including a plurality of memory cells connected in series;
a plurality of word lines commonly connected to the memory strings and connected to the memory cells; and
a control circuit which executes a write operation including a plurality of program loops, each of the program loops including a program operation in which a program voltage is applied to a selected word line and a verify operation in which a threshold voltage of a memory cell is verified,
wherein
when a suspend command for instructing an operation suspend is externally received during execution of the program operation, the control circuit applies a first voltage higher than a ground voltage to the word lines after the program operation and during a suspend period.

11. The device according to claim 10, wherein the first voltage is determined in accordance with the amount by which a voltage of a word line increases from the ground voltage due to capacitive coupling between a channel of the memory string and the word line.

12. The device according to claim 10, wherein the control circuit continuously lowers a voltage of a word line from a voltage used in the program operation to the first voltage.

13. The device according to claim 10, wherein the memory cells are stacked one upon another.

14. A semiconductor memory device comprising:
a memory cell array including a plurality of memory strings, each of the memory strings including a plurality of memory cells connected in series;
a plurality of word lines commonly connected to the memory strings and connected to the memory cells; and
a control circuit which executes a write operation including a plurality of program loops, each of the program loops including a program operation in which a program voltage is applied to a selected word line and a verify operation in which a threshold voltage of a memory cell is verified,
wherein the control circuit
steps up the program voltage each time the program loop is executed,
enters into a suspend mode when a suspend command for instructing an operation suspend is externally received during the write operation, and
controls the program voltage such that the program voltage immediately after the suspend operation is lower than the program voltage applied immediately before the suspend mode.

15. The device according to claim 14, wherein
before the suspend mode, the control circuit steps up the program voltage by a first voltage each time one program loop is executed, and
after the suspend mode, the control circuit steps up at least a program voltage used in a first-time program loop executed immediately after the suspend mode, by a second voltage lower than the first voltage.

16. The device according to claim 15, wherein the control circuit executes a program loop using the second voltage a number of times, and subsequently executes a program loop using the first voltage.

17. The device according to claim 16, wherein the control circuit varies the second voltage.

18. The device according to claim 16, wherein the control circuit increases the second voltage in order in accordance with an increase in the number of program loops executed.

19. The device according to claim 14, wherein the control circuit further executes the verify operation after the suspend mode.

20. The device according to claim 14, wherein the memory cells are stacked one upon another.

* * * * *